United States Patent
Van De Ven et al.

(10) Patent No.: US 7,901,107 B2
(45) Date of Patent: Mar. 8, 2011

(54) LIGHTING DEVICE AND LIGHTING METHOD

(75) Inventors: Antony Paul Van De Ven, Hong Kong SAR (CN); Gerald H. Negley, Durham, NC (US)

(73) Assignee: Cree, Inc., Durham, NC (US)

( * ) Notice: Subject to any disclaimer, the term of this patent is extended or adjusted under 35 U.S.C. 154(b) by 252 days.

(21) Appl. No.: 12/117,148

(22) Filed: May 8, 2008

(65) Prior Publication Data

US 2008/0304261 A1 Dec. 11, 2008

Related U.S. Application Data

(60) Provisional application No. 60/916,608, filed on May 8, 2007.

(51) Int. Cl.
*F21V 9/00* (2006.01)

(52) U.S. Cl. ............. 362/231; 362/545; 257/89; 257/98; 313/485; 315/307

(58) Field of Classification Search ............ 362/84, 362/97.3, 231, 249.02, 260, 545, 612, 800; 313/485; 257/89, 98; 315/307
See application file for complete search history.

(56) References Cited

U.S. PATENT DOCUMENTS

| | | | |
|---|---|---|---|
| 3,805,937 A | 4/1974 | Hatanaka et al. |
| 3,875,456 A | 4/1975 | Kano et al. |
| 3,927,290 A | 12/1975 | Denley |
| 4,120,026 A | 10/1978 | Tsuchihashi et al. |
| 4,325,146 A | 4/1982 | Lennington |
| 4,408,157 A | 10/1983 | Beaubien |
| 4,420,398 A | 12/1983 | Castino |
| 4,710,699 A | 12/1987 | Miyamoto |
| 4,772,885 A | 9/1988 | Uehara et al. |
| 5,087,883 A | 2/1992 | Hoffman |
| 5,166,815 A | 11/1992 | Elderfield |
| 5,264,997 A | 11/1993 | Hutchisson et al. |
| 5,407,799 A | 4/1995 | Studier |
| 5,410,519 A | 4/1995 | Hall et al. |
| 5,477,436 A | 12/1995 | Bertling et al. |
| 5,563,849 A | 10/1996 | Hall et al. |
| 5,803,579 A | 9/1998 | Turnbull et al. |
| 5,851,063 A | 12/1998 | Doughty et al. |
| 5,959,316 A | 9/1999 | Lowery |

(Continued)

FOREIGN PATENT DOCUMENTS

DE 3 916 875 12/1990

(Continued)

OTHER PUBLICATIONS

White Light LED, Part Nos. NSPW300BS and NSPW312BS, High Brightness LEDs, Nov. 12, 1999, Publisher: Nichira Corporation.

(Continued)

*Primary Examiner* — Stephen F Husar
(74) *Attorney, Agent, or Firm* — Burr & Brown

(57) ABSTRACT

A lighting device comprising one or more solid state light emitters which emit near ultraviolet light and one or more lumiphors which emit light having a wavelength in the range of from 490 nm to 555 nm, which in the absence of other light would produce a mixture of light within an area defined by x, y coordinates (0.32, 0.40), (0.36, 0.48), (0.43, 0.45), (0.42, 0.42), and (0.36, 0.38). The lighting device may further comprise one or more 600 nm to 630 nm light emitters, and a mixture of light emitted from the lighting device may be within ten MacAdam ellipses of the blackbody locus. Also, packaged solid state light emitters and methods of lighting.

36 Claims, 7 Drawing Sheets

U.S. PATENT DOCUMENTS

| | | |
|---|---|---|
| 6,066,861 A | 5/2000 | Hohn et al. |
| 6,076,936 A | 6/2000 | George |
| 6,084,250 A | 7/2000 | Justel et al. |
| 6,095,666 A | 8/2000 | Salam |
| 6,132,072 A | 10/2000 | Turnbull et al. |
| 6,212,213 B1 | 4/2001 | Weber et al. |
| 6,234,648 B1 | 5/2001 | Borner et al. |
| 6,252,254 B1 | 6/2001 | Soules |
| 6,255,670 B1 | 7/2001 | Srivastava et al. |
| 6,278,135 B1 | 8/2001 | Srivastava et al. |
| 6,292,901 B1 | 9/2001 | Lys et al. |
| 6,294,800 B1 | 9/2001 | Duggal et al. |
| 6,319,425 B1 | 11/2001 | Tasaki et al. |
| 6,335,538 B1 | 1/2002 | Prutchi et al. |
| 6,337,536 B1 | 1/2002 | Matsubara et al. |
| 6,348,766 B1 | 2/2002 | Ohishi et al. |
| 6,350,041 B1 | 2/2002 | Tarsa et al. |
| 6,357,889 B1 | 3/2002 | Duggal et al. |
| 6,394,621 B1 | 5/2002 | Hanewinkel |
| 6,429,583 B1 | 8/2002 | Levinson et al. |
| 6,441,558 B1 | 8/2002 | Muthu et al. |
| 6,480,299 B1 | 11/2002 | Drakopoulos et al. |
| 6,501,100 B1 | 12/2002 | Srivastava et al. |
| 6,504,179 B1 | 1/2003 | Ellens et al. |
| 6,513,949 B1 | 2/2003 | Marshall et al. |
| 6,522,065 B1 | 2/2003 | Srivastava et al. |
| 6,538,371 B1 | 3/2003 | Duggal et al. |
| 6,550,949 B1 | 4/2003 | Bauer et al. |
| 6,552,495 B1 | 4/2003 | Chang |
| 6,577,073 B2 | 6/2003 | Shimizu et al. |
| 6,592,810 B2 | 7/2003 | Nishida et al. |
| 6,600,175 B1 | 7/2003 | Baretz et al. |
| 6,600,324 B2 | 7/2003 | St-Germain |
| 6,603,258 B1 | 8/2003 | Mueller-Mach et al. |
| 6,608,485 B2 | 8/2003 | St-Germain |
| 6,616,862 B2 | 9/2003 | Srivastava et al. |
| 6,624,350 B2 | 9/2003 | Nixon et al. |
| 6,636,003 B2 | 10/2003 | Rahm et al. |
| 6,642,666 B1 | 11/2003 | St-Germain |
| 6,685,852 B2 | 2/2004 | Setlur et al. |
| 6,686,691 B1 | 2/2004 | Mueller et al. |
| 6,692,136 B2 | 2/2004 | Marshall et al. |
| 6,703,173 B2 | 3/2004 | Lu et al. |
| 6,712,486 B1 | 3/2004 | Popovich et al. |
| 6,737,801 B2 | 5/2004 | Ragle |
| 6,744,194 B2 | 6/2004 | Fukasawa et al. |
| 6,762,563 B2 | 7/2004 | St-Germain |
| 6,784,463 B2 | 8/2004 | Camras et al. |
| 6,791,257 B1 | 9/2004 | Sato et al. |
| 6,817,735 B2 | 11/2004 | Shimizu et al. |
| 6,841,804 B1 | 1/2005 | Chen et al. |
| 6,851,834 B2 | 2/2005 | Leysath |
| 6,880,954 B2 | 4/2005 | Ollett et al. |
| 6,882,101 B2 | 4/2005 | Ragle |
| 6,914,267 B2 | 7/2005 | Fukasawa et al. |
| 6,936,857 B2 | 8/2005 | Doxsee et al. |
| 6,967,116 B2 | 11/2005 | Negley |
| 6,980,176 B2 | 12/2005 | Matsumoto et al. |
| 7,005,679 B2 | 2/2006 | Tarsa et al. |
| 7,008,078 B2 | 3/2006 | Shimizu et al. |
| 7,009,343 B2 | 3/2006 | Lim et al. |
| 7,014,336 B1 | 3/2006 | Ducharme et al. |
| 7,023,019 B2 | 4/2006 | Maeda et al. |
| 7,061,454 B2 | 6/2006 | Sasuga et al. |
| 7,066,623 B2 | 6/2006 | Lee et al. |
| 7,083,302 B2 | 8/2006 | Chen et al. |
| 7,093,958 B2 | 8/2006 | Coushaine |
| 7,095,056 B2 | 8/2006 | Vitta et al. |
| 7,102,172 B2 | 9/2006 | Lynch et al. |
| 7,116,308 B1 | 10/2006 | Heeks et al. |
| 7,118,262 B2 | 10/2006 | Negley et al. |
| 7,125,143 B2 | 10/2006 | Hacker |
| 7,135,664 B2 | 11/2006 | Vornsand et al. |
| 7,144,121 B2 | 12/2006 | Minano et al. |
| 7,164,231 B2 | 1/2007 | Choi et al. |
| 7,207,691 B2 | 4/2007 | Lee et al. |
| 7,213,940 B1 | 5/2007 | Van de Ven et al. |
| 7,215,074 B2 | 5/2007 | Shimizu et al. |
| 7,232,212 B2 | 6/2007 | Iwase |
| 7,239,085 B2 | 7/2007 | Kawamura |
| 7,250,715 B2 | 7/2007 | Mueller et al. |
| 7,255,457 B2 | 8/2007 | Ducharme et al. |
| 7,256,557 B2 | 8/2007 | Lim et al. |
| 7,322,732 B2 | 1/2008 | Negley et al. |
| 7,358,954 B2 | 4/2008 | Negley |
| 7,365,485 B2 | 4/2008 | Fukasawa et al. |
| 7,387,405 B2 | 6/2008 | Ducharme et al. |
| 7,422,504 B2 | 9/2008 | Maeda et al. |
| 7,453,195 B2 | 11/2008 | Radkov |
| 7,474,044 B2 | 1/2009 | Ge |
| 2001/0002049 A1 | 5/2001 | Reeh et al. |
| 2002/0006044 A1 | 1/2002 | Harbers et al. |
| 2002/0070681 A1 | 6/2002 | Shimizu et al. |
| 2002/0087532 A1 | 7/2002 | Barritz et al. |
| 2002/0149576 A1 | 10/2002 | Tanaka et al. |
| 2003/0026096 A1 | 2/2003 | Ellens et al. |
| 2003/0030063 A1 | 2/2003 | Sosniak et al. |
| 2003/0067773 A1 | 4/2003 | Marshall et al. |
| 2003/0146411 A1 | 8/2003 | Srivastava et al. |
| 2003/0222268 A1 | 12/2003 | Yocom et al. |
| 2004/0046178 A1 | 3/2004 | Sano |
| 2004/0105264 A1 | 6/2004 | Spero |
| 2004/0212998 A1 | 10/2004 | Mohacsi |
| 2004/0217364 A1 | 11/2004 | Tarsa et al. |
| 2004/0218387 A1 | 11/2004 | Gerlach |
| 2004/0218388 A1 | 11/2004 | Suzuki |
| 2004/0239839 A1 | 12/2004 | Hong |
| 2004/0264193 A1 | 12/2004 | Okumura |
| 2004/0264212 A1 | 12/2004 | Chung et al. |
| 2005/0007306 A1 | 1/2005 | Iisaka et al. |
| 2005/0052378 A1 | 3/2005 | Hacker |
| 2005/0190141 A1 | 9/2005 | Roth et al. |
| 2005/0231976 A1 | 10/2005 | Keuper et al. |
| 2005/0243556 A1 | 11/2005 | Lynch |
| 2005/0251698 A1 | 11/2005 | Lynch et al. |
| 2005/0259423 A1 | 11/2005 | Heuser et al. |
| 2005/0274972 A1 | 12/2005 | Roth et al. |
| 2006/0012989 A1 | 1/2006 | Lee |
| 2006/0022582 A1 | 2/2006 | Radkov |
| 2006/0060872 A1 | 3/2006 | Edmond et al. |
| 2006/0067073 A1 | 3/2006 | Ting |
| 2006/0071589 A1 | 4/2006 | Radkov |
| 2006/0105482 A1 | 5/2006 | Alferink et al. |
| 2006/0113548 A1 | 6/2006 | Chen et al. |
| 2006/0138435 A1 | 6/2006 | Tarsa et al. |
| 2006/0138937 A1 | 6/2006 | Ibbetson |
| 2006/0152140 A1 | 7/2006 | Brandes |
| 2006/0152172 A9 | 7/2006 | Mueller et al. |
| 2006/0180818 A1 | 8/2006 | Nagai et al. |
| 2006/0181192 A1 | 8/2006 | Radkov et al. |
| 2006/0245184 A1 | 11/2006 | Galli |
| 2007/0001188 A1 | 1/2007 | Lee |
| 2007/0001994 A1 | 1/2007 | Roth |
| 2007/0041220 A1 | 2/2007 | Lynch |
| 2007/0051966 A1 | 3/2007 | Higashi et al. |
| 2007/0090381 A1 | 4/2007 | Otsuka et al. |
| 2007/0137074 A1 | 6/2007 | Van De Ven et al. |
| 2007/0139920 A1 | 6/2007 | Van De Ven et al. |
| 2007/0139923 A1 | 6/2007 | Negley |
| 2007/0170447 A1 | 7/2007 | Negley et al. |
| 2007/0171145 A1 | 7/2007 | Coleman et al. |
| 2007/0202623 A1 | 8/2007 | Gao |
| 2007/0223219 A1 | 9/2007 | Medendorp et al. |
| 2007/0236911 A1 | 10/2007 | Negley |
| 2007/0247414 A1 | 10/2007 | Robert |
| 2007/0247847 A1 | 10/2007 | Villard |
| 2007/0262337 A1 | 11/2007 | Villard |
| 2007/0263393 A1 | 11/2007 | Van De Ven et al. |
| 2007/0267983 A1 | 11/2007 | Van De Ven et al. |
| 2007/0274063 A1 | 11/2007 | Negley |
| 2007/0274080 A1 | 11/2007 | Negley et al. |
| 2007/0276606 A1 | 11/2007 | Radkov |
| 2007/0278503 A1 | 12/2007 | Van De Ven et al. |
| 2007/0278934 A1 | 12/2007 | Van De Ven et al. |
| 2007/0278974 A1 | 12/2007 | Van De Ven |
| 2007/0279440 A1 | 12/2007 | Negley |
| 2007/0279903 A1 | 12/2007 | Negley |

| | | | | | |
|---|---|---|---|---|---|
| 2007/0280624 A1 | 12/2007 | Negley et al. | WO | 00/34709 | 6/2000 |
| 2008/0084685 A1 | 4/2008 | Van De Ven | WO | 01/41215 | 6/2001 |
| 2008/0084700 A1 | 4/2008 | Negley | WO | 01/43113 | 6/2001 |
| 2008/0084701 A1 | 4/2008 | Van De Ven et al. | WO | 01/69692 | 9/2001 |
| 2008/0088248 A1 | 4/2008 | Myers | WO | 03/056876 | 7/2003 |
| 2008/0089053 A1 | 4/2008 | Negley | WO | 03/091771 | 11/2003 |
| 2008/0106895 A1 | 5/2008 | Van De Ven | WO | 2004/068909 | 8/2004 |
| 2008/0106907 A1 | 5/2008 | Trott et al. | WO | 2005/004202 | 1/2005 |
| 2008/0112168 A1 | 5/2008 | Pickard et al. | WO | 2005013365 | 2/2005 |
| 2008/0112170 A1 | 5/2008 | Trott et al. | WO | WO 2005/124877 | 12/2005 |
| 2008/0112183 A1 | 5/2008 | Negley | WO | 2006/028312 | 3/2006 |
| 2008/0130265 A1 | 6/2008 | Negley | WO | 2007/061758 | 5/2007 |
| 2008/0130282 A1 | 6/2008 | Negley | | | |
| 2008/0130285 A1 | 6/2008 | Negley | | | |
| 2008/0136313 A1 | 6/2008 | Negley | | | |
| 2008/0137347 A1 | 6/2008 | Trott et al. | | | |
| 2008/0170396 A1 | 7/2008 | Yuan et al. | | | |
| 2008/0179602 A1 | 7/2008 | Negley | | | |
| 2008/0192462 A1 | 8/2008 | Steedly et al. | | | |
| 2008/0192493 A1 | 8/2008 | Villard | | | |
| 2008/0211416 A1 | 9/2008 | Negley et al. | | | |
| 2008/0231201 A1 | 9/2008 | Higley et al. | | | |
| 2008/0259589 A1 | 10/2008 | Van De Ven et al. | | | |
| 2008/0278928 A1 | 11/2008 | Van De Ven et al. | | | |
| 2008/0278940 A1 | 11/2008 | Van De Ven et al. | | | |
| 2008/0278950 A1 | 11/2008 | Pickard et al. | | | |
| 2008/0278952 A1 | 11/2008 | Trott et al. | | | |
| 2008/0304260 A1 | 12/2008 | Van De Ven et al. | | | |
| 2008/0304261 A1 | 12/2008 | Van De Ven et al. | | | |
| 2008/0304269 A1 | 12/2008 | Pickard et al. | | | |
| 2008/0309255 A1 | 12/2008 | Myers | | | |
| 2008/0310154 A1 | 12/2008 | Van De Ven et al. | | | |
| 2009/0002986 A1 | 1/2009 | Medendorp et al. | | | |
| 2009/0108269 A1 | 4/2009 | Negley | | | |
| 2009/0160363 A1 | 6/2009 | Negley | | | |
| 2009/0161356 A1 | 6/2009 | Negley | | | |
| 2009/0184616 A1 | 7/2009 | Van de Ven | | | |
| 2009/0184666 A1 | 7/2009 | Myers | | | |
| 2009/0246895 A1 | 10/2009 | You | | | |

FOREIGN PATENT DOCUMENTS

| | | |
|---|---|---|
| DE | 3916875 | 12/1990 |
| DE | 10-335077 | 3/2005 |
| EP | 0 838 866 | 4/1998 |
| EP | 0 971 421 | 1/2000 |
| EP | 1 024 399 A1 | 8/2000 |
| EP | 1 081 771 | 3/2001 |
| EP | 1 160 883 A2 | 12/2001 |
| EP | 1 193 772 | 4/2002 |
| EP | 1 367 655 | 12/2003 |
| EP | 1 380 876 | 1/2004 |
| EP | 1 462 711 | 12/2004 |
| EP | 1 566 848 | 8/2005 |
| EP | 1 571 715 | 9/2005 |
| EP | 1 760 795 | 1/2006 |
| JP | 04-159519 | 6/1992 |
| JP | 09-146089 | 6/1997 |
| JP | 10-163535 | 6/1998 |
| JP | 2000-022222 | 1/2000 |
| JP | 2000-183408 | 6/2000 |
| JP | 2001-111114 | 4/2001 |
| JP | 2001-156331 | 6/2001 |
| JP | 2001-307506 | 11/2001 |
| JP | 2002-150821 | 5/2002 |
| JP | 2003-515956 | 5/2003 |
| JP | 2003-529889 | 10/2003 |
| JP | 2004-080046 | 3/2004 |
| JP | 2004-103443 | 4/2004 |
| JP | 2004-253309 | 9/2004 |
| JP | 2004-356116 | 12/2004 |
| JP | 2004-363055 | 12/2004 |
| JP | 2005-005482 | 1/2005 |
| JP | 2005-101296 | 4/2005 |
| JP | 2005-142311 | 6/2005 |
| JP | 2007-122950 | 5/2007 |
| JP | 2007-141737 | 6/2007 |
| TW | 546854 | 8/2003 |
| WO | 98/43014 | 10/1998 |
| WO | 99/66483 | 12/1999 |

OTHER PUBLICATIONS

Chhajed, S., *Influence of junction temperature on chromaticity and color-rendering properties of trichromatic white-light sources* . . . , Journal of Applied Physics, 2005, vol. 97pp. 1-8.

Color Kinetics Inc., Color Kinetics Support : White Papers & Presentations; available at http://www.colorkinetics.com/support/whitepapers/:, Solid State Lighting White Papers & Presentations, Feb. 22, 2006, pp. 1-4.

Color Kinetics Inc., *Color Quality of Intelligent Solid-State Light Systems*, Color Quality of Solid-State Light Sources, Mar. 2005, pp. 1-3.

Compound Semiconductors Online, "LED Lighting Fixtures, Inc. Sets World Record at 80 Lumens per Watt for Warm White", Compound Semiconductors Online, May 30, 2006, pp. 1.

Cree, Inc., "Cree® Xlamp® 7090 XR-E Series LED Binning and Labeling," Application Note: CLD-AP08.000, 7pp (2006).

CSA International, "Test Data Report," Project No. 1786317, Report No. 1786317-1 (Apr. 2006).

Krames et al., *Lumileds Lighting, Light from Silicon Valley*, Progress and Future Direction of LED Technology, SSL Workshop, Nov. 13, 2003, Publisher: Limileds Lighting Inc., pp. 1-21.

Narendran et al., "Solid State lighting: failure analysis of white LEDs," Journal of Cystal Growth, vol. 268, Issues 1-4, Aug. 2004, Abstract.

Narendran et al., *Color Rendering Properties of LED Light Sources*, 2002, pp. 1-8.

Nichia, White Light LED, Part Nos. NSPW300BS and NSPW312BS, High Brightness LEDs, Nov. 12, 1999, Publisher: Nichia Corporation.

Press Release from LED Lighting Fixtures dated Apr. 24, 2006 entitled "LED Lighting Fixtures, Inc. achieves unprecedented gain in light output from new luminaire".

Press Release from LED Lighting Fixtures dated Feb. 16, 2006 entitled "LED Lighting Fixtures, Inc. Announces Record Performance".

Press Release from LED Lighting Fixtures dated Feb. 7, 2007 entitled "LED Lighting Fixtures Announces its first LED-based Recessed Down Light".

Press Release from LED Lighting Fixtures dated Jan. 26, 2006 entitled "LED Lighting Fixtures Creates 750 Lumen Recessed Light and Uses Only 16 Watts of Power".

Press Release from LED Lighting Fixtures dated May 30, 2006 entitled "LED Lighting Fixtures, Inc. Sets World Record at 80 Lumens per Watt for Warm White Fixture".

Press Release from LED Lighting Fixtures dated Nov. 28, 2007 entitled "New Lamp from LED Lighting Fixtures Shatter World Record for Energy Efficiency".

Shimizu, "Development of High-Efficiency LED Downlight", First International Conference on White LEDs and Solid State Lighting, Nov. 30, 2007.

U.S. Department of Energy, "DOE Solid-State Lighting CALiPER Program, Summary of Results: Round 3 of Product Testing," Oct. 2007.

U.S. Department of Energy, "DOE Solid-State Lighting CALiPER Program, Summary of Results: Round 4 of Product Testing," Jan. 2008.

U.S. Department of Energy, "DOE Solid-State Lighting CALiPER Program, Summary of Results: Round 5 of Product Testing," May 2008.

Van De Ven et al., "Warm White Illumination with High CRI and High Efficacy by Combining 455 nm Excited Yellowish Phosphor LEDs and Red AlInGaP LEDs," First International Conference on White LEDs and Solid State Lighting, Nov. 30, 2007.

OptoLED Lighting Inc., *OptoLED Product Information*, 2009, Publisher: OptoLED GmBH website: accessed at http://222.optoled.de/englisch/products/led.html.

Permlight Inc., *Enbryten LED Product Information*, Feb. 2005, Publisher: Permlight Inc. website; accessed at http://www.webarchive.org displaying that www.permlight.com/products/LEDfixtures.asp was publicly available Jan. 2004.

U.S. Appl. No. 61/075,513, filed Jun. 25, 2008, Roberts.

LIGHTING DEVICE AND LIGHTING METHOD

CROSS-REFERENCE TO RELATED APPLICATIONS

This application claims the benefit of U.S. Provisional Patent Application No. 60/916,608, filed May 8, 2007, the entirety of which is incorporated herein by reference.

FIELD OF THE INVENTION(S)

The present inventive subject matter relates to a lighting device, in particular, a device which includes one or more solid state light emitters (e.g., light emitting diodes) and one or more luminescent materials (e.g., one or more phosphors). The present inventive subject matter is also directed to a packaged solid state light emitter. The present inventive subject matter is also directed to lighting methods.

BACKGROUND OF THE INVENTION(S)

A large proportion (some estimates are as high as twenty-five percent) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about ten) but are still less efficient than solid state light emitters, such as light emitting diodes.

In addition, as compared to the normal lifetimes of solid state light emitters, incandescent light bulbs have relatively short lifetimes, i.e., typically about 750-1000 hours. In comparison, light emitting diodes, for example, have typical lifetimes between 50,000 and 70,000 hours. Fluorescent bulbs have longer lifetimes (e.g., 10,000-20,000 hours) than incandescent lights, but provide less favorable color reproduction.

Color reproduction is typically measured using the Color Rendering Index (CRI Ra). CRI Ra is a modified average of the relative measurements of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower). Sodium lights are used, e.g., to light highways. Driver response time, however, significantly decreases with lower CRI Ra values (for any given brightness, legibility decreases with lower CRI Ra).

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which solid state light emitters can be used in place of incandescent lights, fluorescent lights and other light-generating devices in a wide variety of applications. In addition, where solid state light emitters are already being used, efforts are ongoing to provide solid state light emitter-containing devices which are improved, e.g., with respect to energy efficiency, color rendering index (CRI Ra), contrast, efficacy (1 m/W), and/or duration of service.

One group of solid state light emitters are light emitting diodes. Light emitting diodes are well-known semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present inventive subject matter can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The commonly recognized and commercially available light emitting diode ("LED") that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Although the development of solid state light emitters, e.g., light emitting diodes, has in many ways revolutionized the lighting industry, some of the characteristics of solid state light emitters have presented challenges, some of which have not yet been fully met. For example, the emission spectrum of any particular light emitting diode is typically concentrated around a single wavelength (as dictated by the light emitting diode's composition and structure), which is desirable for some applications, but not desirable for others, (e.g., for providing lighting, such an emission spectrum provides a very low CRI Ra).

Because light that is perceived as white is necessarily a blend of light of two or more colors (or wavelengths), no single light emitting diode junction has been developed that can produce white light efficiently. "White" light emitting diode lamps have been produced which have a light emitting diode pixel/cluster formed of respective red, green and blue light emitting diodes. Other "white" light emitting diode lamps have been produced which include (1) a light emitting diode which generates blue light and (2) a luminescent material (e.g., a phosphor) that emits yellow light in response to excitation by light emitted by the light emitting diode, whereby the blue light and the yellow light, when mixed, produce light that is perceived as white light.

In general, the 1931 CIE Chromaticity Diagram (an international standard for primary colors established in 1931), and the 1976 CIE Chromaticity Diagram (similar to the 1931 Diagram but modified such that similar distances on the Diagram represent similar perceived differences in color) provide useful reference for defining colors as weighted sums of colors.

A wide variety of luminescent materials (and structures which contain luminescent materials, known as lumiphors or luminophoric media, e.g., as disclosed in U.S. Pat. No. 6,600, 175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished by adding the luminescent materials to a clear or substantially transparent encapsulant material (e.g., epoxy-based, silicone-based, glass-based or metal-oxide based material) as discussed above, for example by a blending or coating process.

For example, U.S. Pat. No. 6,963,166 (Yano '166) discloses that a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. According to Yano '166, the first resin portion is obtained by filling the cup reflector with a resin material and curing it after the light emitting diode chip has been mounted onto the bottom of the cup reflector and then has had its cathode and anode electrodes electrically connected to the leads by way of wires. According to Yano '166, a phosphor is dispersed in the first resin portion so as to be excited with the light A that has been emitted from the light emitting diode chip, the excited phosphor produces fluorescence ("light B") that has a longer wavelength than the light A, a portion of the light A is transmitted through the first resin portion including the phosphor, and as a result, light C, as a mixture of the light A and light B, is used as illumination.

As noted above, "white LED lamps" (i.e., lamps which are perceived as being white or near-white) have been investigated as potential replacements for white incandescent lamps. A representative example of a white LED lamp includes a package of a blue light emitting diode chip, made of indium gallium nitride (InGaN) or gallium nitride (GaN), coated with a phosphor such as YAG. In such an LED lamp, the blue light emitting diode chip produces a blue emission and the phosphor produces yellow fluorescence on receiving that emission. For instance, in some designs, white light emitting diode lamps are fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor, which becomes excited and emits a yellow ray. The part of the blue light emitted by the light emitting diode which is transmitted through the phosphor is mixed with the yellow light emitted by the phosphor. The viewer perceives the mixture of blue and yellow light as white light. Another type uses a blue or violet light emitting diode chip which is combined with phosphor materials that produce red or orange and green or yellowish-green light rays. In such a lamp, part of the blue or violet light emitted by the light emitting diode chip excites the phosphors, causing the phosphors to emit red or orange and yellow or green light rays. These rays, combined with the blue or violet rays, can produce the perception of white light.

As also noted above, in another type of LED lamp, a light emitting diode chip that emits an ultraviolet ray is combined with phosphor materials that produce red (R), green (G) and blue (B) light rays. In such an "RGB LED lamp", the ultraviolet ray that has been radiated from the light emitting diode chip excites the phosphor, causing the phosphor to emit red, green and blue light rays which, when mixed, are perceived by the human eye as white light. Consequently, white light can also be obtained as a mixture of these light rays.

Designs have been provided in which existing LED component packages and other electronics are assembled into a fixture. In such designs, a packaged LED is mounted to a circuit board or directly to a heat sink, the circuit board is mounted to a heat sink, and the heat sink is mounted to the fixture housing along with required drive electronics. In many cases, additional optics (secondary to the package parts) are also necessary.

In substituting solid state light emitters for other light sources, e.g., incandescent light bulbs, packaged LEDs have been used with conventional light fixtures, for example, fixtures which include a hollow lens and a base plate attached to the lens, the base plate having a conventional socket housing with one or more contacts which are electrically coupled to a power source. For example, LED light bulbs have been constructed which comprise an electrical circuit board, a plurality of packaged LEDs mounted to the circuit board, and a connection post attached to the circuit board and adapted to be connected to the socket housing of the light fixture, whereby the plurality of LEDs can be illuminated by the power source.

There is an ongoing need for ways to use solid state light emitters, e.g., light emitting diodes, to provide white light in a wider variety of applications, with greater energy efficiency, with improved color rendering index (CRI Ra), with improved efficacy (1 m/W), and/or with longer duration of service.

BRIEF SUMMARY OF THE INVENTION (S)

There exist "white" LED light sources which are relatively efficient but which have poor color rendering, typically having CRI Ra values of less than 75, and which are particularity deficient in the rendering of red colors and also to a significant extent deficient in green. This means that many things, including the typical human complexion, food items, labeling, painting, posters, signs, apparel, home decoration, plants, flowers, automobiles, etc. exhibit odd or wrong color as compared to being illuminated with an incandescent light or natural daylight. Typically, such white LED lamps have a color temperature of approximately 5000 K, which is generally not visually comfortable for general illumination, which may, however, be desirable for the illumination of commercial produce or advertising and printed materials.

Some so-called "warm white" LED lamps have a more acceptable color temperature (typically 2700 to 3500 K) for indoor use, and in some special cases, good CRI Ra (in the case of a yellow and red phosphor mix, as high as Ra=95), but their efficiency is generally significantly less than that of the standard "cool white" LED lamps.

Colored objects illuminated by RGB LED lamps sometimes do not appear in their true colors. For example, an object that reflects only yellow light, and thus that appears to be yellow when illuminated with white light, may appear duller and de-emphasized (or de-saturated and grayish) when illuminated with light having an apparent yellow color, produced by the red and green LEDs of an RGB LED fixture. Such lamps, therefore, are considered not to provide excellent color rendition, particularly when illuminating various settings such as in general illumination, and particularly with regard to natural scenes. In addition, currently available green LEDs are relatively inefficient, and thus limit the efficiency of such lamps.

Employing LEDs having a wide variety of hues would similarly necessitate use of LEDs having a variety of efficiencies, including some with low efficiency, thereby reducing the efficiency of such systems, and dramatically increasing the complexity and cost of the circuitry to control the many different types of LEDs and maintain the color balance of the light.

There is therefore a need for a high efficiency white light source that combines the efficiency and long life of white LED lamps (i.e., which avoids the use of relatively inefficient light sources) with an acceptable color temperature, good color rendering index, a wide gamut and simple control circuitry.

In an effort to obtain high CRI Ra while obtaining high efficacy, in accordance with the present inventive subject matter, there are provided methods which comprise:

illuminating a first group of solid state light emitters, such that each of the first group of solid state light emitters emits light having a peak wavelength in the near ultraviolet range;
 exciting a first group of lumiphors, such that each of the first group of lumiphors emits light having a dominant wavelength in the range of from about 490 nm to about 555 nm;
 wherein:
  a mixture of (1) light emitted from the lighting device which was emitted by the first group of solid state light emitters and (2) light emitted from the lighting device which was emitted by the first group of lumiphors would, in the absence of any additional light, have a mixed illumination having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38, and combining such a mixture of light with orange or red light which, when combined with the mixture of light, will provide light that is perceived as white light.

The expression "dominant wavelength", is used herein according to its well-known and accepted meaning to refer to the perceived color of a spectrum, i.e., the single wavelength of light which produces a color sensation most similar to the color sensation perceived from viewing light emitted by the light source (i.e., it is roughly akin to "hue"), as opposed to "peak wavelength", which is well-known to refer to the spectral line with the greatest power in the spectral power distribution of the light source. Because the human eye does not perceive all wavelengths equally (it perceives yellow and green better than red and blue), and because the light emitted by many solid state light emitter (e.g., LEDs) is actually a range of wavelengths, the color perceived (i.e., the dominant wavelength) is not necessarily equal to (and often differs from) the wavelength with the highest power (peak wavelength). A truly monochromatic light such as a laser has the same dominant and peak wavelengths. Ultraviolet (UV) is by definition non-visible and therefore unable to be defined in terms of a dominant wavelength. UV is defined by bands or peak wavelength or wavelength range. UV is defined as having a wavelength between 100 nm and 400 nm. There is crossover between the wavelengths of some visible colors such as deep purple or violet and UV. This crossover range is from 360 nm to 400 nm. Light in this range can be defined in terms of both dominant or peak wavelength. For clarification, any wavelength used herein to characterize illumination or excitation by near UV light, and/or any illumination or excitation within any range which encompasses any wavelength below 400 nm, will refer to its peak wavelength.

According to a first aspect of the present inventive subject matter, there is provided a lighting device comprising:

a first group of solid state light emitters; and
 a first group of lumiphors;
 wherein:
  each of the first group of solid state light emitters, if illuminated, would emit light having a peak wavelength in the near ultraviolet range;
  each of the first group of lumiphors, if excited, would emit light having a dominant wavelength in the range of from about 490 nm to about 555 nm;
  if each of the first group of solid state light emitters is illuminated, a mixture of (1) light emitted from the lighting device which was emitted by the first group of solid state light emitters and (2) light emitted from the lighting device which was emitted by the first group of lumiphors would, in the absence of any additional light, have a mixed illumination having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to this aspect of the present inventive subject matter, if each of the first group of solid state light emitters is illuminated, the lighting device would emit light having a CRI Ra of at least 85, in some embodiments at least 90, in some embodiments at least 92, and in some embodiments at least 95.

According to a second aspect of the present inventive subject matter, there is provided a lighting device comprising:
 a first group of solid state light emitters;
 a first group of lumiphors; and
 at least a first power line,
 wherein:
  each of the first group of solid state light emitters, if illuminated, would emit light having a peak wavelength in the near ultraviolet range;
  each of the first group of lumiphors, if excited, would emit light having a dominant wavelength in the range of from about 490 nm to about 555 nm;
  if energy is supplied to the first power line, a mixture of (1) light emitted from the lighting device which was emitted by the first group of solid state light emitters and (2) light emitted from the lighting device which was emitted by the first group of lumiphors would, in the absence of any additional light, have a mixed illumination having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

According to a third aspect of the present inventive subject matter, there is provided a method of lighting, comprising:
 illuminating a first group of solid state light emitters, such that each of the first group of solid state light emitters emits light having a peak wavelength in the near ultraviolet range;
 exciting a first group of lumiphors, such that each of the first group of lumiphors emits light having a dominant wavelength in the range of from about 490 nm to about 555 nm;
 wherein:
  a mixture of (1) light emitted from the lighting device which was emitted by the first group of solid state light emitters and (2) light emitted from the lighting device which was emitted by the first group of lumiphors would, in the absence of any additional light, have a mixed illumination having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to this aspect of the present inventive subject matter, a mixture of light emitted from the lighting device has a CRI Ra of at least 85, in some embodiments at least 90, in some embodiments at least 92, and in some embodiments at least 95.

In some embodiments according to the first, second and third aspects of the present inventive subject matter, at least one of the first group of solid state light emitters comprises a light emitting diode.

In some embodiments according to the first, second and third aspects of the present inventive subject matter, each of the first group of solid state light emitters, if illuminated, would emit light having a peak wavelength in the range of from about 380 nm to about 430 nm.

In some embodiments according to the first, second and third aspects of the present inventive subject matter, each of the first group of solid state light emitters, if illuminated, would emit light having a peak wavelength in the range of from about 380 nm to about 410 nm.

In some embodiments according to the first, second and third aspects of the present inventive subject matter, each of the first group of lumiphors, if excited, would emit light having a dominant wavelength of about 490 nm.

In some embodiments according to the first and second aspects of the present inventive subject matter: (1) the lighting device further comprises a second group of lumiphors, and (2) the second group of lumiphors, if excited, would emit light having a dominant wavelength in the range of from about 600 nm to about 630 nm. In some such embodiments, if each of the first group of solid state light emitters is illuminated, a mixture of (1) light emitted from the lighting device which was emitted by the first group of solid state light emitters, (2) light emitted from the lighting device which was emitted by the first group of lumiphors, and (3) light emitted from the lighting device which was emitted by the second group of lumiphors would, in the absence of any additional light, have a combined illumination having x, y coordinates on a 1931 CIE Chromaticity Diagram which define a point which is within forty MacAdam ellipses (or twenty MacAdam ellipses, or ten MacAdam ellipses, or five MacAdam ellipses, or three MacAdam ellipses) of at least one point on the blackbody locus on a 1931 CIE Chromaticity Diagram.

In some embodiments according to the first and second aspects of the present inventive subject matter: (1) the lighting device further comprises a second group of solid state light emitters, and (2) the second group of solid state light emitters, if illuminated, would emit light having a dominant wavelength in the range of from about 600 nm to about 630 nm. In some such embodiments, if each of the first group of solid state light emitters is illuminated, and each of the second group of solid state light emitters is illuminated, a mixture of (1) light emitted from the lighting device which was emitted by the first group of solid state light emitters, (2) light emitted from the lighting device which was emitted by the first group of lumiphors, and (3) light emitted from the lighting device which was emitted by the second group of solid state light emitters would, in the absence of any additional light, have a combined illumination having x, y coordinates on a 1931 CIE Chromaticity Diagram which define a point which is within forty MacAdam ellipses (or twenty MacAdam ellipses, or ten MacAdam ellipses, or five MacAdam ellipses, or three MacAdam ellipses) of at least one point on the blackbody locus on a 1931 CIE Chromaticity Diagram.

In some embodiments according to the first and second aspects of the present inventive subject matter, the lighting device further comprises an encapsulant and is in the form of a packaged solid state light emitter.

In some embodiments according to the third aspect of the present inventive subject matter, the method further comprises exciting a second group of lumiphors, such that each of the second group of lumiphors emits light having a dominant wavelength in the range of from about 600 nm to about 630 nm. In some such embodiments, a mixture of (1) light emitted from the lighting device which was emitted by the first group of solid state light emitters, (2) light emitted from the lighting device which was emitted by the first group of lumiphors, and (3) light emitted from the lighting device which was emitted by the second group of lumiphors would, in the absence of any additional light, have a combined illumination having x, y coordinates on a 1931 CIE Chromaticity Diagram which define a point which is within forty MacAdam ellipses (or twenty MacAdam ellipses, or ten MacAdam ellipses, or five MacAdam ellipses, or three MacAdam ellipses) of at least one point on the blackbody locus on a 1931 CIE Chromaticity Diagram.

In some embodiments according to the third aspect of the present inventive subject matter, the method further comprises illuminating a second group of solid state light emitters, such that each of the second group of solid state light emitters emits light having a dominant wavelength in the range of from about 600 nm to about 630 nm. In some such embodiments, a mixture of (1) light emitted from the lighting device which was emitted by the first group of solid state light emitters, (2) light emitted from the lighting device which was emitted by the first group of lumiphors, and (3) light emitted from the lighting device which was emitted by the second group of solid state light emitters would, in the absence of any additional light, have a combined illumination having x, y coordinates on a 1931 CIE Chromaticity Diagram which define a point which is within forty MacAdam ellipses (or twenty MacAdam ellipses, or ten MacAdam ellipses, or five MacAdam ellipses, or three MacAdam ellipses) of at least one point on the blackbody locus on a 1931 CIE Chromaticity Diagram.

In some embodiments according to the second aspect of the present inventive subject matter, if energy is supplied to the first power line, a mixture of all light emitted from the lighting device from solid state light emitters and lumiphors which emit light having a dominant wavelength which is outside the range of between 600 nm and 700 nm would have x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

According to a fourth aspect of the present inventive subject matter, there is provided a packaged solid state light emitter, comprising:
 a first solid state light emitter; and
 a first group of lumiphors;
 wherein:
  the first solid state light emitter, if illuminated, would emit light having a peak wavelength in the near ultraviolet range;
  each of the first group of lumiphors, if excited, would emit light having a dominant wavelength in the range of from about 490 nm to about 555 nm;
  if the first solid state light emitter is illuminated, a mixture of (1) light emitted from the lighting device which was emitted by the first solid state light emitter and (2) light emitted from the lighting device which was emitted by the first group of lumiphors would, in the absence of any additional light, have a mixed illumination having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to the fourth aspect of the present inventive subject matter, the packaged solid state light emitter further comprises a second group of lumiphors, and each of the second group of lumiphors, if excited, would emit light having a dominant wavelength in the range of from about 600 nm to about 630 nm. In some such embodiments, if the first solid state light emitter is illuminated, a mixture of (1) light emitted from the packaged solid state light emitter which was emitted by the first solid state light emitter, (2) light emitted from the packaged solid state light emitter which was emitted by the first group of lumiphors, and (3) light emitted from the packaged solid state light emitter which was emitted by the second group of lumiphors would produce a combined illumination having x, y coordinates on a 1931 CIE Chromaticity Diagram which define a point which is within forty MacAdam ellipses (or twenty MacAdam ellipses, or ten MacAdam ellipses, or five MacAdam ellipses, or three MacAdam ellipses) of at least one point on the blackbody locus on a 1931 CIE Chromaticity Diagram.

Optionally, one or more lumiphors (or luminescent material) which emits light having a dominant wavelength in the range of from about 430 nm to about 480 nm, and/or one or more solid state light emitter which emits light having a dominant wavelength in the range of from about 430 nm to about 480 nm, can be included in any of the devices (or methods) described herein.

The present inventive subject matter further relates to an illuminated enclosure (the volume of which can be illuminated uniformly or non-uniformly), comprising an enclosed space and at least one lighting device according to the present inventive subject matter, wherein the lighting device illuminates at least a portion of the enclosed space (uniformly or non-uniformly).

The present inventive subject matter is further directed to a structure comprising a surface and at least one lighting device as described herein, wherein if one or more of the solid state light emitters is illuminated (or if current is supplied to one or more power line), the lighting device would illuminate at least a portion of the surface.

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device as described herein.

In some embodiments according to the present inventive subject matter, the lighting device further comprises at least one additional white solid state light emitter, i.e., a device which emits light which is perceived as white or near white (e.g., a packaged LED which contains at least one light emitting diode chip and/or at least one lumiphor which, when illuminated and/or excited, emits a combination of light which is perceived as white or near white, such as a packaged LED which consists of a blue light emitting diode chip and a yellow lumiphor), in which the one or more additional white solid state light emitters each emit a combination of light which has x, y color coordinates which define a point which is outside the first area on a 1931 CIE Chromaticity Diagram enclosed by the first, second, third, fourth and fifth line segments as defined above.

In some embodiments according to the present inventive subject matter, the mixed illumination has x, y color coordinates which define a point which is within a first sub-group area on a 1931 CIE Chromaticity Diagram which is enclosed by first, second, third and fourth line segments, the first line segment connecting a first point to a second point, the second line segment connecting the second point to a third point, the third line segment connecting the third point to a fourth point, and the fourth line segment connecting the fourth point to the first point, the first point having x, y coordinates of 0.32, 0.40, the second point having x, y coordinates of 0.36, 0.38, the third point having x, y coordinates of 0.41, 0.455, and the fourth point having x, y coordinates of 0.36, 0.48 (or, the first point having x, y coordinates of 0.376, 0.487, the second point having x, y coordinates of 0.407, 0.470, the third point having x, y coordinates of 0.359, 0.384, and the fourth point having x, y coordinates of 0.326, 0.391, or the mixed illumination is within a sub-area in which x is in the range of from about 0.373 to about 0.383 and y is in the range of from about 0.441 to about 0.451, or within a sub-area in which x is in the range of from about 0.454 to about 0.464 and y is in the range of from about 0.407 to about 0.417, or within a sub-area in which x is in the range of from about 0.367 to about 0.377 and y is in the range of from about 0.431 to about 0.441, or within a sub-area in which x is in the range of from about 0.443 to about 0.453 and y is in the range of from about 0.402 to about 0.412, or within a sub-area in which x is in the range of from about 0.363 to about 0.373 and y is in the range of from about 0.423 to about 0.433, or within a sub-area in which x is in the range of from about 0.435 to about 0.445 and y is in the range of from about 0.398 to about 0.408, or within a sub-area in which x is in the range of from about 0.352 to about 0.362 and y is in the range of from about 0.403 to about 0.413, or within a sub-area in which x is in the range of from about 0.406 to about 0.416 and y is in the range of from about 0.388 to about 0.398.

The solid state light emitters can be saturated or non-saturated. The term "saturated", as used herein, means having a purity of at least 85%, the term "purity" having a well-known meaning to persons skilled in the art, and procedures for calculating purity being well-known to those of skill in the art.

Aspects related to the present inventive subject matter can be represented on either the 1931 CIE (Commission International de l'Eclairage) Chromaticity Diagram or the 1976 CIE Chromaticity Diagram. FIG. 1 shows the 1931 CIE Chromaticity Diagram. FIG. 2 shows the 1976 Chromaticity Diagram. FIG. 3 shows a portion of the 1976 Chromaticity Diagram, including the blackbody locus. Persons of skill in the art are familiar with these diagrams, and these diagrams are readily available (e.g., by searching "CE Chromaticity Diagram" on the internet).

The CIE Chromaticity Diagrams map out the human color perception in terms of two CIE parameters x and y (in the case of the 1931 diagram) or u' and v' (in the case of the 1976 diagram). For a technical description of CIE chromaticity diagrams, see, for example, "Encyclopedia of Physical Science and Technology", vol. 7, 230-231 (Robert A Meyers ed., 1987). The spectral colors are distributed around the edge of the outlined space, which includes all of the hues perceived by the human eye. The boundary line represents maximum saturation for the spectral colors. As noted above, the 1976 CIE Chromaticity Diagram is similar to the 1931 Diagram, except that the 1976 Diagram has been modified such that similar distances on the Diagram represent similar perceived differences in color.

In the 1931 Diagram, deviation from a point on the Diagram can be expressed either in terms of the coordinates or, alternatively, in order to give an indication as to the extent of the perceived difference in color, in terms of MacAdam ellipses. For example, a locus of points defined as being ten MacAdam ellipses from a specified hue defined by a particular set of coordinates on the 1931 Diagram consists of hues which would each be perceived as differing from the specified hue to a common extent (and likewise for loci of points defined as being spaced from a particular hue by other quantities of MacAdam ellipses).

Since similar distances on the 1976 Diagram represent similar perceived differences in color, deviation from a point on the 1976 Diagram can be expressed in terms of the coordinates, u' and v', e.g., distance from the point=$(\Delta u'^2+\Delta v'^2)^{1/2}$, and the hues defined by a locus of points which are each a common distance from a specified hue consist of hues which would each be perceived as differing from the specified hue to a common extent.

The chromaticity coordinates and the CIE chromaticity diagrams illustrated in FIGS. 1-3 are explained in detail in a number of books and other publications, such as pages 98-107 of K. H. Butler, "Fluorescent Lamp Phosphors" (The Pennsylvania State University Press 1980) and pages 109-110 of G. Blasse et al., "Luminescent Materials" (Springer-Verlag 1994), both incorporated herein by reference.

The chromaticity coordinates (i.e., color points) that lie along the blackbody locus obey Planck's equation: $E(\lambda)=A\lambda^{-5}/(e^{(B/T)}-1)$, where E is the emission intensity, X is the emission wavelength, T the color temperature of the blackbody and A and B are constants. Color coordinates that lie on or near the blackbody locus yield pleasing white light to a human observer. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally blueish. This occurs because the wavelength associated with the peak radiation of the blackbody radiator becomes progressively shorter with increased temperature, consistent with the Wien Displacement Law. Illuminants which produce light which is on or near the blackbody locus can thus be described in terms of their color temperature.

The present inventive subject matter may be more fully understood with reference to the accompanying drawings and the following detailed description of the inventive subject matter.

BRIEF DESCRIPTION OF THE DRAWING FIGURES

DETAILED DESCRIPTION OF THE INVENTION(S)

Figure 1:
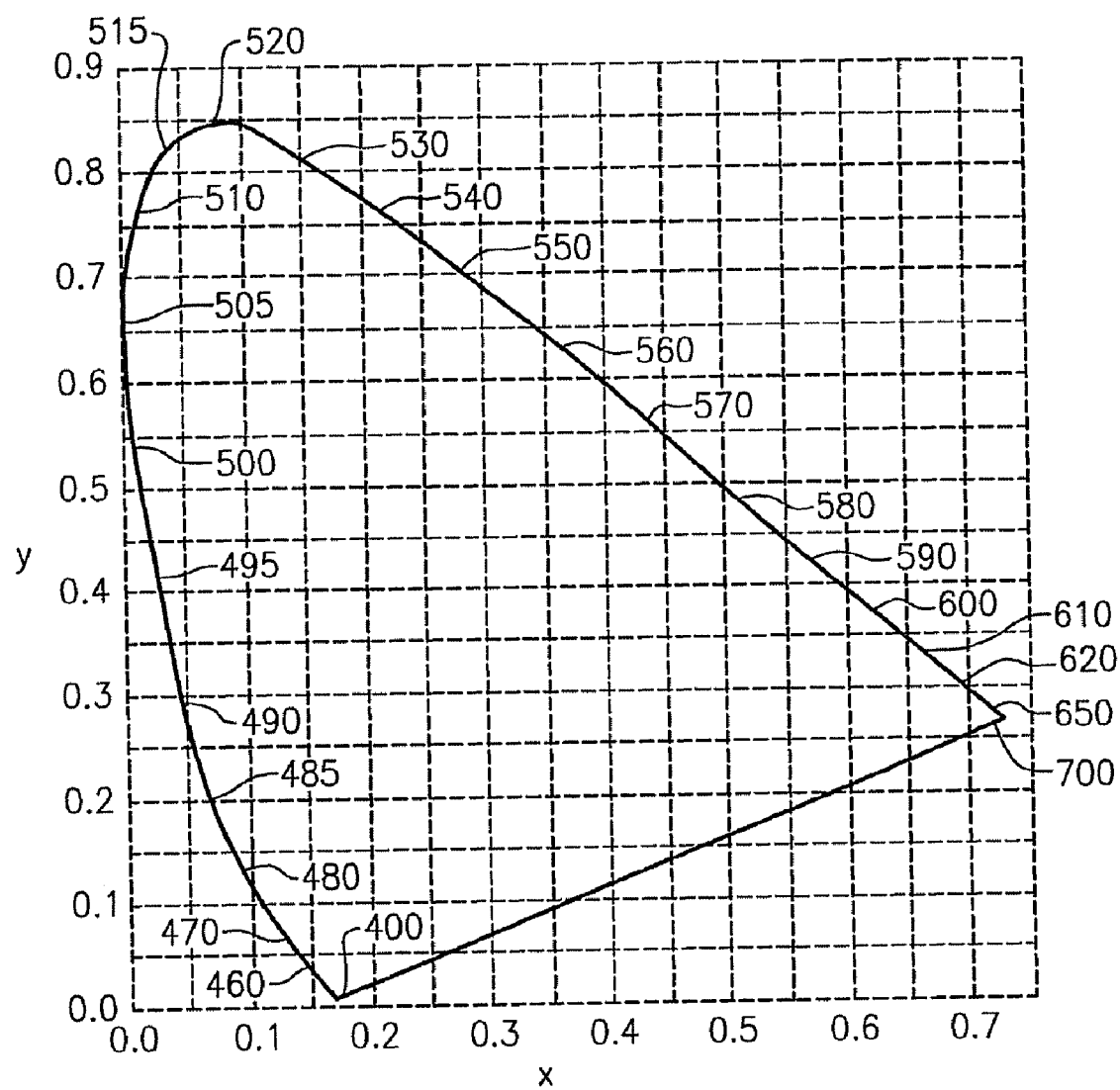
FIG. 1 shows the 1931 CIE Chromaticity Diagram.
Figure 2:
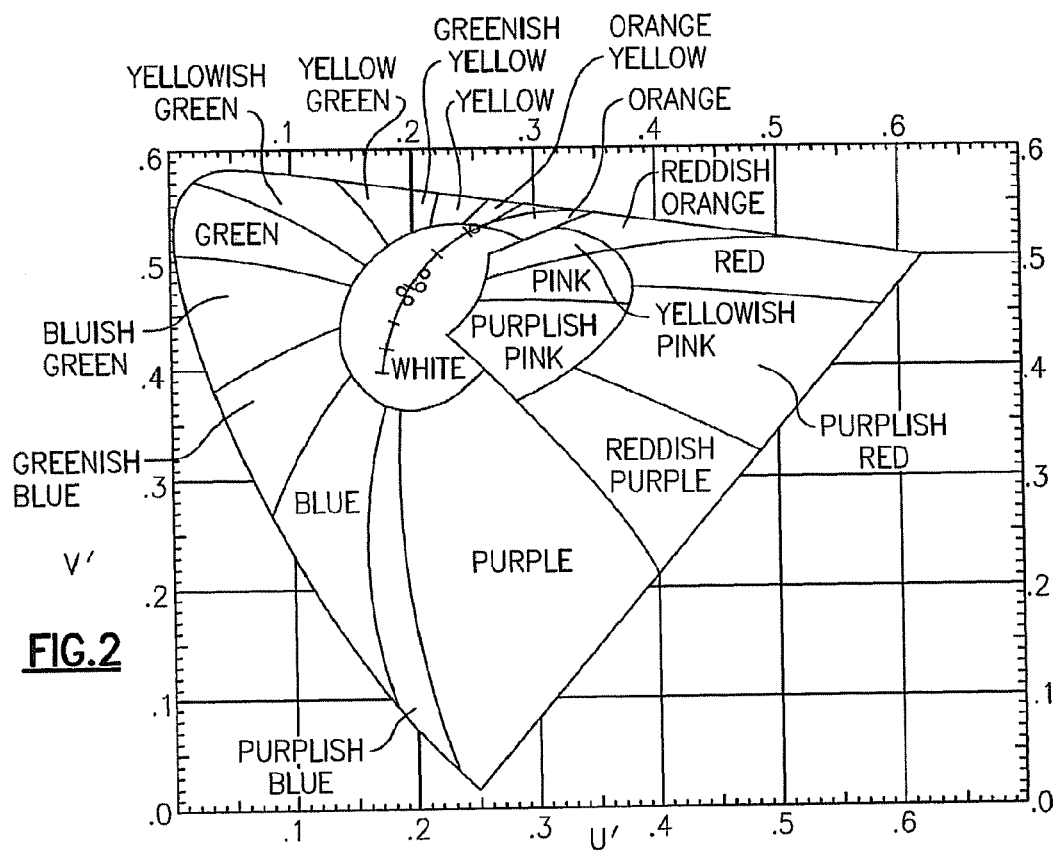
FIG. 2 shows the 1976 Chromaticity Diagram.
Figure 3:
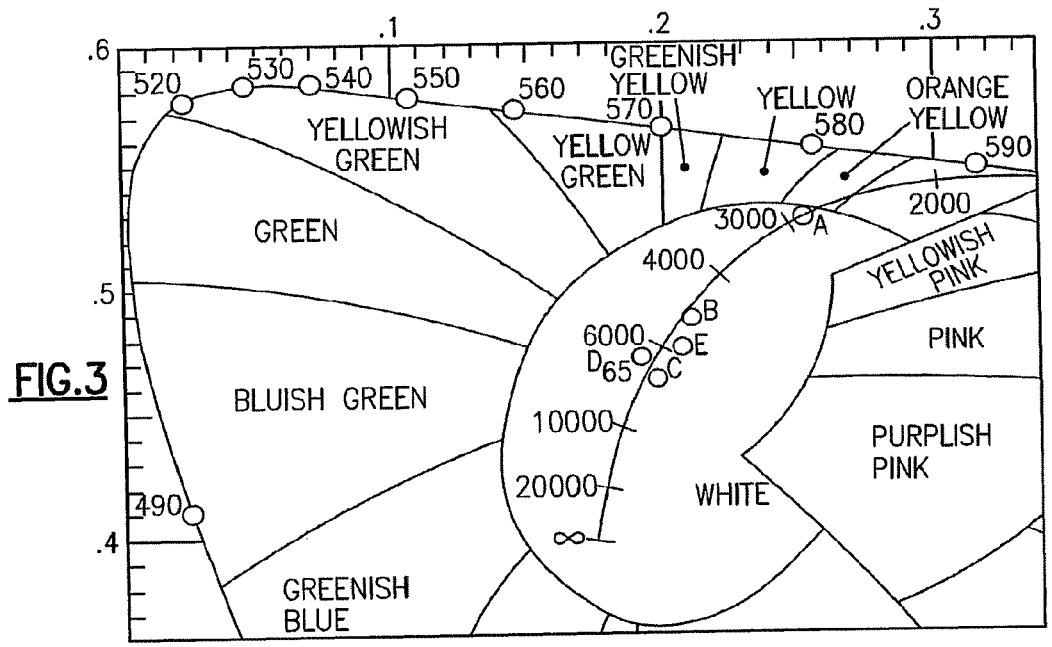
FIG. 3 shows a portion of the 1976 Chromaticity Diagram, including the blackbody locus.

The present inventive subject matter now will be described more fully hereinafter with reference to the accompanying drawings, in which embodiments of the inventive subject matter are shown. However, this inventive subject matter should not be construed as limited to the embodiments set forth herein. Rather, these embodiments are provided so that this disclosure will be thorough and complete, and will fully convey the scope of the inventive subject matter to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The expression "lighting device", as used herein, is not limited, except that it indicates that the device is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

When an element such as a layer, region or substrate is referred to herein as being "on" or extending "onto" another element, it can be directly on or extend directly onto the other element or intervening elements may also be present. In contrast, when an element is referred to herein as being "directly on" or extending "directly onto" another element, there are no intervening elements present. Also, when an element is referred to herein as being "connected" or "coupled" to another element, it can be directly connected or coupled to the other element or intervening elements may be present. In contrast, when an element is referred to herein as being "directly connected" or "directly coupled" to another element, there are no intervening elements present.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Furthermore, relative terms, such as "lower" or "bottom" and "upper" or "top," may be used herein to describe one element's relationship to another elements as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The expression "380 nm to 430 nm solid state light emitter" means any solid state light emitter which, if illuminated, would emit light having a peak wavelength in the range of from about 380 nm to about 430 nm.

The expression "600 nm to 630 nm solid state light emitter" means any solid state light emitter which, if illuminated, would emit light having a dominant wavelength in the range of from about 600 nm to about 630 nm.

The term "current", as used in the expression "if current is supplied to the first power line" means electrical current which is sufficient to cause the solid state light emitter(s) to emit light having a dominant wavelength (or peak wavelength) in the corresponding range described herein.

The expression "directly or switchably electrically connected" means "directly electrically connected" or "switchably electrically connected."

A statement herein that one or more solid state light emitters are "electrically connected" to a power line means that current can be supplied to the solid state light emitter(s) by supplying current to the power line.

A statement herein that one or more switch is electrically connected to a power line means that current can flow through the power line if the switch (or switches) are closed, and current can be prevented from flowing through the power line if the switch (or one or more of the switches) is open.

A statement herein that two components in a device are "switchably electrically connected" means that there is a switch located between the two components, the switch being selectively closed or opened, wherein if the switch is closed, the two components are electrically connected, and if the switch is open (i.e., during any time period that the switch is open), the two components are not electrically connected.

The expression "illumination" (or "illuminated"), as used herein when referring to a solid state light emitter, means that at least some current is being supplied to the solid state light emitter to cause the solid state light emitter to emit at least some electromagnetic radiation with at least a portion of the emitted radiation having a wavelength between 100 nm and 1000 nm. The expression "illuminated" also encompasses situations where the solid state light emitter emits light continuously or intermittently at a rate such that if it is or was visible light, a human eye would perceive it as emitting light continuously, or where a plurality of solid state light emitters of the same color or different colors are emitting light intermittently and/or alternatingly (with or without overlap in "on" times) in such a way that if they were or are visible light, a human eye would perceive them as emitting light continuously (and, in cases where different colors are emitted, as a mixture of those colors).

The expression "excited", as used herein when referring to a lumiphor, means that at least some electromagnetic radiation (e.g., visible light, UV light or infrared light) is contacting the lumiphor, causing the lumiphor to emit at least some light. The expression "excited" encompasses situations where the lumiphor emits light continuously or intermittently at a rate such that a human eye would perceive it as emitting light continuously, or where a plurality of lumiphors of the same color or different colors are emitting light intermittently and/or alternatingly (with or without overlap in "on" times) in such a way that a human eye would perceive them as emitting light continuously (and, in cases where different colors are emitted, as a mixture of those colors).

In any of the lighting devices described herein, where reference is made to a "group" of solid state light emitters (e.g., a "first group of solid state light emitters"), the group can consist of a single solid state light emitter or a plurality of solid state light emitters. Similarly, where reference is made to a "group" of lumiphors (e.g., a "first group of lumiphors"), the group can consist of a single lumiphor or a plurality of lumiphors.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

In any of the lighting devices described herein, any combination of the elements included in the lighting device can be packaged together (e.g., as a light emitting diode package). For example, some embodiments of lighting devices according to the first or second aspects of the present inventive subject matter comprise a package which comprises (1) at least one of the first group of solid state light emitters and at least one of the first group of lumiphors, (2) at least one of the first group of solid state light emitters and at least one of the second group of lumiphors, or (3) at least one of the first group of solid state light emitters, at least one of the first group of lumiphors, and at least one of the second group of lumiphors. Similarly, some embodiments of the first and second aspects of the present inventive subject matter can comprise plural packages which comprise one or more of any of the first group of solid state light emitters, the second group of solid state light emitters, the first group of lumiphors and (when present) the second group of lumiphors.

The lumiphors contained in each lighting device according to the present inventive subject matter can be excited by any of the light emitted by any solid state light emitter contained in the device and/or by any of the light emitted by any other lumiphor contained in the device. A wide variety of schemes can readily be envisioned, and all of these schemes are included in the present inventive subject matter. For instance, in a device which includes a single solid state light emitter, a first lumiphor and a second lumiphor, the lumiphors can be positioned (e.g., "stacked") so that some of the light emitted by the solid state light emitter passes through the first lumiphor and excites the second lumiphor. Alternatively, all of the light emitted by the solid state light emitter can be absorbed in the first lumiphor or the second lumiphor (thereby exciting the first and second lumiphors, and causing the first and second lumiphors to emit light), or all of the light emitted by the solid state light emitter can be absorbed in the first lumiphor (thereby exciting the first lumiphor and causing the first lumiphor to emit light). Similarly, some or all of the light emitted by the first lumiphor (upon being excited as a result of absorbing some or all of the light emitted by the solid state light emitter) can be absorbed by the second lumiphor or pass through the second lumiphor. Alternatively, the lumiphors can be arranged such that light emitted by the solid state light emitter first contacts the second lumiphor and then the first lumiphor, or contacts any of the lumiphors without previously passing through any other of the lumiphors. Moreover, there can be more than one solid state light emitter, and/or more than one of the first and/or second lumiphors arranged in any desired way such that any portion or all of the light emitted from each comes into contact with any desired component, or exits from the lighting device without contacting any other component.

The solid state light emitters used in the devices according to the present inventive subject matter, and the lumiphor (or lumiphors) used in the devices according to the present inventive subject matter, can be selected from among any solid state light emitters and lumiphors known to persons of skill in the art. Wide varieties of such solid state light emitters and lumiphors are readily obtainable and well known to those of skilled in the art, and any of them can be employed. For example, solid state light emitters and lumiphors which may be used in practicing the present inventive subject matter are described in:

U.S. patent application Ser. No. 60/753,138, filed on Dec. 22, 2005, entitled "LIGHTING DEVICE" (inventor: Gerald H. Negley) and U.S. patent application Ser. No. 11/614,180, filed Dec. 21, 2006, (now U.S. Patent Publication No. 2007/0236911), the entireties of which are hereby incorporated by reference;

U.S. patent application Ser. No. 60/794,379, filed on Apr. 24, 2006, entitled "SHIFTING SPECTRAL CONTENT IN LEDS BY SPATIALLY SEPARATING LUMIPHOR FILMS" (inventors: Gerald H. Negley and Antony Paul van de Ven) and U.S. patent application Ser. No. 11/624,811, filed Jan. 19, 2007, (now U.S. Patent Publication No. 2007/0170447), the entireties of which are hereby incorporated by reference;

U.S. patent application Ser. No. 60/808,702, filed on May 26, 2006, entitled "LIGHTING DEVICE" (inventors: Gerald H. Negley and Antony Paul van de Ven) and U.S. patent application Ser. No. 11/751,982, filed May 22, 2007( now U.S. Patent Publication No. 2007/0274080), the entireties of which are hereby incorporated by reference;

U.S. patent application Ser. No. 60/808,925, filed on May 26, 2006, entitled "SOLID STATE LIGHT EMITTING DEVICE AND METHOD OF MAKING SAME" (inventors: Gerald H. Negley and Neal Hunter) and U.S. patent application Ser. No. 11/753,103, filed May 24, 2007(now U.S. Patent Publication No. 2007/0280624), the entireties of which are hereby incorporated by reference;

U.S. patent application Ser. No. 60/802,697, filed on May 23, 2006, entitled "LIGHTING DEVICE AND METHOD OF MAKING" (inventor: Gerald H. Negley) and U.S. patent application Ser. No. 11/751,990, filed May 22, 2007, the (now U.S. Patent Publication No. 2007/0274063), entireties of which are hereby incorporated by reference;

U.S. patent application Ser. No. 60/793,524, filed on Apr. 20, 2006, entitled "LIGHTING DEVICE AND LIGHTING METHOD" (inventors: Gerald H. Negley and Antony Paul van de Ven) and U.S. patent application Ser. No. 11/736,761, filed Apr. 18, 2007, (now U.S. patent Publication No. 2007/0278934), the entireties of which are hereby incorporated by reference;

U.S. patent application Ser. No. 60/839,453, filed on Aug. 23, 2006, entitled "LIGHTING DEVICE AND LIGHTING METHOD" (inventors: Antony Paul van de Ven and Gerald H. Negley) and U.S. patent application Ser. No. 11/843,243, filed Aug. 22, 2007, (now U.S. Patent Publication No. 2008/0084685), the entireties of which are hereby incorporated by reference;

U.S. patent application Ser. No. 60/851,230, filed on Oct. 12, 2006, entitled "LIGHTING DEVICE AND METHOD OF MAKING SAME" (inventor: Gerald H. Negley) and U.S. patent application Ser. No. 11/870,679, filed Oct. 11, 2007, (now U.S. Patent Publication No. 2008/0089053), the entireties of which are hereby incorporated by reference;

U.S. patent application Ser. No. 60/916,608, filed on May 8, 2007, entitled "LIGHTING DEVICE AND LIGHTING METHOD" (inventors: Antony Paul van de Ven and Gerald H. Negley), the entirety of which is hereby incorporated by reference; and U.S. patent application Ser. No. 12/017,676, filed on Jan. 22, 2008, (now U.S. Patent Publication No. 2009/0108269), entitled "ILLUMINATION DEVICE HAVING ONE OR MORE LUMIPHORS, AND METHODS OF FABRICATING SAME" (inventors: Gerald H. Negley and Antony Paul van de Ven), U.S. patent application Ser. No. 60/982,900, filed on Oct. 26, 2007 (inventors: Gerald H. Negley and Antony Paul van de Ven), the entirety of which is hereby incorporated by reference.

Examples of types of such solid state light emitters include inorganic light emitting diodes and organic light emitting diodes, a variety of each of which are well-known in the art.

The one or more luminescent materials can be any desired luminescent material. The one or more luminescent materials can be down-converting or up-converting, or can include a combination of both types. For example, the one or more luminescent materials can be selected from among phosphors, scintillators, day glow tapes, inks which glow in the visible spectrum upon illumination with ultraviolet light, etc.

The one or more luminescent materials can be provided in any desired form. For example, the luminescent material can be embedded in a resin (i.e., a polymeric matrix), such as a silicone material, an epoxy, a substantially transparent glass or a metal oxide material.

The one or more lumiphors can individually be any lumiphor, a wide variety of which, as noted above, are known to those skilled in the art. For example, the (or each of the) lumiphor(s) can comprise (or can consist essentially of, or can consist of) one or more phosphor. The (or each of the) one or more lumiphors can, if desired, further comprise (or consist essentially of, or consist of) one or more highly transmissive (e.g., transparent or substantially transparent, or somewhat diffuse) binder, e.g., made of epoxy, silicone, glass, metal oxide or any other suitable material (for example, in any given lumiphor comprising one or more binder, one or more phosphor can be dispersed within the one or more binder). For example, the thicker the lumiphor, in general, the lower the weight percentage of the phosphor can be. Depending on the overall thickness of the lumiphor, however, the weight percentage of the phosphor could be generally any value, e.g., from 0.1 weight percent to 100 weight percent (e.g., a lumiphor formed by subjecting pure phosphor to a hot isostatic pressing procedure).

Some embodiments according to the present inventive subject matter comprise a single lumiphor, while other embodiments comprise more than one lumiphor. Where more than one lumiphor is present, the lumiphors can be separate and/or can be provided in any desired arrangement. For instance, the first group of lumiphors can consist of a single first group lumiphor and the second group of lumiphors can consist of a single second group lumiphor. Alternatively, the first group of lumiphors and the second group of lumiphors can together consist of a single lumiphor (i.e., a "first group-second group lumiphor"). In other embodiments, the lighting device can comprise at least a first mixed lumiphor, the first mixed lumiphor comprising at least one of the first group of lumiphors and at least one of the second group of lumiphors. For example, two or more types of luminescent powders which, upon excitation, emit light within different ranges as specified herein can be mixed together and embedded in a single encapsulant structure and/or occupy different regions within a single encapsulant structure. Similarly, two or more luminescent elements, each of which contains respective luminescent powders which, upon excitation, emit light within different ranges as specified herein, can occupy different regions of a single lumiphor.

The (or each of the) one or more lumiphors can, independently, further comprise any of a number of well-known additives, e.g., diffusers, scatterers, tints, etc.

In some embodiments according to the present inventive subject matter, one or more of the light emitting diode chips can be included in a package together with one or more of the lumiphors, and the one or more lumiphor in the package can be spaced from the one or more light emitting diode chip in the package to achieve improved light extraction efficiency, as described in U.S. patent application Ser. No. 60/753,138, filed on Dec. 22, 2005, entitled "LIGHTING DEVICE" (inventor: Gerald H. Negley) and U.S. patent application Ser. No. 11/614,180, filed Dec. 21, 2006, (now U.S. Patent Publication No. 2007/0236911), the entireties of which are hereby incorporated by reference.

In some embodiments according to the present inventive subject matter, two or more lumiphors can be provided, two or more of the lumiphors being spaced from each other, as described in U.S. patent application Ser. No. 60/794,379, filed on Apr. 24, 2006, entitled "SHIFTING SPECTRAL CONTENT IN LEDS BY SPATIALLY SEPARATING LUMIPHOR FILMS" (inventors: Gerald H. Negley and Antony Paul van de Ven) and U.S. patent application Ser. No. 11/624,811, filed Jan. 19, 2007, (now. U.S. Patent Publication No. 2007/0170447), the entireties of which are hereby incorporated by reference.

In some embodiments of the present inventive subject matter, a set of parallel solid state light emitter strings (i.e., two or more strings of solid state light emitters arranged in parallel with each other) is arranged in series with a power line, such that current is supplied through the power line to each of the respective strings of solid state light emitter. The expression "string", as used herein, means that at least two solid state light emitters are electrically connected in series. In some such embodiments, the relative quantities of solid state light emitters in the respective strings differ from one string to the next, e.g., a first string contains a first percentage of near ultraviolet solid state light emitters and a second string contains a second percentage (different from the first percentage) of near ultraviolet solid state light emitters. As a representative example, first and second strings each contain solely (i.e., 100%) near ultraviolet solid state light emitters, and a third string contains 50% near ultraviolet solid state light emitters and 50% 600 nm to 630 nm solid state light emitters (each of the three strings being electrically connected to a common power line). By doing so, it is possible to easily adjust the relative intensities of the light of the respective wavelengths, and thereby effectively navigate within the CIE Diagram and/or compensate for other changes. For example, the intensity of red light can be increased, when necessary, in order to compensate for any reduction of the intensity of the light generated by 600 nm to 630 nm solid state light emitters.

In some embodiments of the present inventive subject matter, there are further provided one or more current adjusters directly or switchably electrically connected to one or more of respective strings of solid state light emitters, whereby the current adjuster can be adjusted to adjust the current supplied to one or more of the respective strings of solid state light emitters. In some of such embodiments, the current adjuster(s) is/are automatically adjusted to maintain the mixture of light within forty MacAdam ellipses (or twenty MacAdam ellipses, or ten MacAdam ellipses, or five MacAdam ellipses, or three MacAdam ellipses) of at least one point on the blackbody locus on a 1931 CIE Chromaticity Diagram.

With regard to any mixed light described herein in terms of its proximity (e.g., in MacAdam ellipses) to the blackbody locus on a 1931 CIE Chromaticity Diagram and/or on a 1976 CIE Chromaticity Diagram, the present inventive subject matter is further directed to such mixed light in the proximity of light on the blackbody locus having color temperature of 2700 K, 3000 K or 3500 K, namely:

mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4578, 0.4101, the second point having x, y coordinates of 0.4813, 0.4319, the third point having x, y coordinates of 0.4562, 0.4260, the fourth point having x, y coordinates of 0.4373, 0.3893, and the fifth point having x, y coordinates of 0.4593, 0.3944 (i.e., proximate to 2700 K); or mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4338, 0.4030, the second point having x, y coordinates of 0.4562, 0.4260, the third point having x, y coordinates of 0.4299, 0.4165, the fourth point having x, y coordinates of 0.4147, 0.3814, and the fifth point having x, y coordinates of 0.4373, 0.3893 (i.e., proximate to 3000 K); or mixed light having x, y color coordinates which define a point which is within an area on a 1931 CE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4073, 0.3930, the second point having x, y coordinates of 0.4299, 0.4165, the third point having x, y coordinates of 0.3996, 0.4015, the fourth point having x, y coordinates of 0.3889, 0.3690, and the fifth point having x, y coordinates of 0.4147, 0.3814 (i.e., proximate to 3500 K).

In some embodiments of the present inventive subject matter, there are further provided one or more switches electrically connected to one or more of the respective strings, whereby the switch selectively switches on and off current to the solid state light emitter(s) on the respective string.

In some embodiments of the present inventive subject matter, one or more current adjusters and/or one or more switches automatically interrupt and/or adjust current passing through one or more respective strings in response to a detected change in the output from the lighting device (e.g., an extent of deviation from the blackbody locus) or in accordance with a desired pattern (e.g., based on the time of day or night, such as altering the correlated color temperature of the combined emitted light).

In some embodiments of the present inventive subject matter, there are further provided one or more thermistors which detect temperature and, as temperature changes, cause one or more current adjusters and/or one or more switches to automatically interrupt and/or adjust current passing through one or more respective strings in order to compensate for such temperature change. In general, 600 nm to 630 nm light emitting diodes get dimmer as their temperature increases—in such embodiments, fluctuations in intensity caused by such temperature variation can be compensated for.

In some lighting devices according to the present inventive subject matter, there are further included one or more circuitry components, e.g., drive electronics for supplying and controlling current passed through at least one of the one or more solid state light emitters in the lighting device. Persons of skill in the art are familiar with a wide variety of ways to supply and control the current passed through solid state light emitters, and any such ways can be employed in the devices of the present inventive subject matter. For example, such circuitry can include at least one contact, at least one leadframe, at least one current regulator, at least one power control, at least one voltage control, at least one boost, at least one capacitor and/or at least one bridge rectifier, persons of skill in the art being familiar with such components and being readily able to design appropriate circuitry to meet whatever current flow characteristics are desired. For example, circuitry which may be used in practicing the present inventive subject matter is described in:

U.S. patent application Ser. No. 60/809,959, filed on Jun. 1, 2006, entitled "LIGHTING DEVICE WITH COOLING" (inventors: Thomas G. Coleman, Gerald H. Negley and Antony Paul van de Ven) and U.S. patent application Ser. No. 11/626, 483, filed Jan. 24, 2007, (now U.S. Patent Publication No. 2007/0171145), the entireties of which are hereby incorporated by reference;

U.S. patent application Ser. No. 60/809,595, filed on May 31, 2006, entitled "LIGHTING DEVICE AND METHOD OF LIGHTING" (inventor: Gerald H. Negley) and U.S. patent application Ser. No. 11/755,162, filed May 30, 2007, (now. U.S. Patent Publication No. 2007/0279440), the entireties of which are hereby incorporated by reference;

U.S. patent application Ser. No. 60/844,325, filed on Sep. 13, 2006, entitled "BOOST/FLYBACK POWER SUPPLY TOPOLOGY WITH LOW SIDE MOSFET CURRENT CONTROL" (inventor: Peter Jay Myers), and U.S. patent application Ser. No. 11/854,744, filed Sep. 13, 2007, (now. U.S. Patent Publication No. 2008/0088248), entitled "CIRCUITRY FOR SUPPLYING ELECTRICAL POWER TO LOADS", the entireties of which are hereby incorporated by reference;

U.S. patent application Ser. No. 60/943,910, filed on Jun. 14, 2007, entitled "DEVICES AND METHODS FOR POWER CONVERSION FOR LIGHTING DEVICES WHICH INCLUDE SOLID STATE LIGHT EMITTERS" (inventor: Peter Jay Myers);

U.S. patent application Ser. No. 60/990,724, filed on Nov. 28, 2007, entitled "SOLID STATE LIGHTING DEVICES AND METHODS OF MANUFACTURING THE SAME" (inventors: Gerald H. Negley, Antony Paul van de Ven, Kenneth R. Byrd and Peter Jay Myers) and U.S. patent application Ser. No. 61/041,404, filed on Apr. 1, 2008, the entireties of which are hereby incorporated by reference; and U.S. patent application Ser. No. 61/022,886, filed on Jan. 23, 2008, entitled "FREQUENCY CONVERTED DIMMING SIGNAL GENERATION" (inventors: Peter Jay Myers, Michael Harris and Terry Given) and U.S. patent application Ser. No. 61/039,926, filed Mar. 27, 2008, the entireties of which are hereby incorporated by reference.

In addition, persons of skill in the art are familiar with a wide variety of mounting structures for many different types of lighting, and any such structures can be used according to the present inventive subject matter.

For example, fixtures, other mounting structures and complete lighting assemblies which may be used in practicing the present inventive subject matter are described in:

U.S. patent application Ser. No. 60/752,753, filed on Dec. 21, 2005, entitled "LIGHTING DEVICE" (inventors: Gerald H. Negley, Antony Paul van de Ven and Neal Hunter) and U.S. patent application Ser. No. 11/613,692, filed Dec. 20, 2006, (now U.S. Patent Publication No. 2007/0139923), the entireties of which are hereby incorporated by reference;

U.S. patent application Ser. No. 60/798,446, filed on May 5, 2006, entitled "LIGHTING DEVICE" (inventor: Antony Paul van de Ven) and U.S. patent application Ser. No. 11/743, 754, filed May 3, 2007, (now U.S. Patent Publication No. 2007/0263393), the entireties of which are hereby incorporated by reference;

U.S. patent application Ser. No. 60/809,618, filed on May 31, 2006, entitled "LIGHTING DEVICE AND METHOD OF LIGHTING" (inventors: Gerald H. Negley, Antony Paul van de Ven and Thomas G. Coleman) and U.S. patent application Ser. No. 11/755,153, filed May 30, 2007, (now U.S. Patent Publication No. 2007/0279903), the entireties of which are hereby incorporated by reference;

U.S. patent application Ser. No. 60/845,429, filed on Sep. 18, 2006, entitled "LIGHTING DEVICES, LIGHTING ASSEMBLIES, FIXTURES AND METHODS OF USING SAME" (inventor: Antony Paul van de Ven), and U.S. patent application Ser. No. 11/856,421, filed Sep. 17, 2007, (now U.S. Patent Publication No. 2008/0084700), the entireties of which are hereby incorporated by reference;

U.S. patent application Ser. No. 60/846,222, filed on Sep. 21, 2006, entitled "LIGHTING ASSEMBLIES, METHODS OF INSTALLING SAME, AND METHODS OF REPLACING LIGHTS" (inventors: Antony Paul van de Ven and Gerald H. Negley), and U.S. patent application Ser. No. 11/859, 048, filed Sep. 21, 2007, (now U.S. Patent Publication No. 2008/0084701), the entireties of which are hereby incorporated by reference;

U.S. patent application Ser. No. 60/858,558, filed on Nov. 13, 2006, entitled "LIGHTING DEVICE, ILLUMINATED ENCLOSURE AND LIGHTING METHODS" (inventor: Gerald H. Negley) and U.S. patent application Ser. No. 11/939,047, filed Nov. 13, 2007, (now U.S. Patent Publication No. 2008/0112183), the entireties of which are hereby incorporated by reference;

U.S. patent application Ser. No. 60/858,881, filed on Nov. 14, 2006, entitled "LIGHT ENGINE ASSEMBLIES" (inventors: Paul Kenneth Pickard and Gary David Trott) and U.S. patent application Ser. No. 11/939,052, filed Nov. 13, 2007, (now U.S. Patent Publication No. 2008/0112168), the entireties of which are hereby incorporated by reference;

U.S. patent application Ser. No. 60/859,013, filed on Nov. 14, 2006, entitled "LIGHTING ASSEMBLIES AND COMPONENTS FOR LIGHTING ASSEMBLIES" (inventors: Gary David Trott and Paul Kenneth Pickard) and U.S. patent application Ser. No. 11/939,059, filed Nov. 13, 2007, (now U.S. Patent Publication No. 2008/0112170), the entireties of which are hereby incorporated by reference;

U.S. patent application Ser. No. 60/853,589, filed on Oct. 23, 2006, entitled "LIGHTING DEVICES AND METHODS OF INSTALLING LIGHT ENGINE HOUSINGS AND/OR TRIM ELEMENTS IN LIGHTING DEVICE HOUSINGS" (inventors: Gary David Trott and Paul Kenneth Pickard) and U.S. patent application Ser. No. 11/877,038, filed Oct. 23, 2007, (now U.S. Patent Publication No. 2008/0106907), the entireties of which are hereby incorporated by reference;

U.S. patent application Ser. No. 60/861,901, filed on Nov. 30, 2006, entitled "LED DOWNLIGHT WITH ACCESSORY ATTACHMENT" (inventors: Gary David Trott, Paul Kenneth Pickard and Ed Adams), the entirety of which is hereby incorporated by reference;

U.S. patent application Ser. No. 60/916,384, filed on May 7, 2007, entitled "LIGHT FIXTURES, LIGHTING DEVICES, AND COMPONENTS FOR THE SAME" (inventors: Paul Kenneth Pickard, Gary David Trott and Ed Adams), and U.S. patent application Ser. No. 11/948,041, filed Nov. 30, 2007 (now U.S. Patent Publication No. 2008/

0137347) (inventors: Gary David Trott, Paul Kenneth Pickard and Ed Adams), the entireties of which are hereby incorporated by reference;

U.S. patent application Ser. No. 60/916,030, filed on May 4, 2007, entitled "LIGHTING FIXTURE" (inventors: "Paul Kenneth Pickard, James Michael LAY and Gary David Trott), the entirety of which is hereby incorporated by reference;

U.S. patent application Ser. No. 60/916,407, filed on May 7, 2007, entitled "LIGHT FIXTURES AND LIGHTING DEVICES" (inventors: Gary David Trott and Paul Kenneth Pickard), the entirety of which is hereby incorporated by reference; and U.S. patent application Ser. No. 61/029,068, filed on Feb. 15, 2008, entitled "LIGHT FIXTURES AND LIGHTING DEVICES" (inventors: Paul Kenneth Pickard and Gary David Trott), and U.S. patent application Ser. No. 61/037,366, filed on Mar. 18, 2008 the entireties of which are hereby incorporated by reference.

In some lighting devices according to the present inventive subject matter, there are further included one or more power sources, e.g., one or more batteries and/or solar cells, and/or one or more standard AC power plugs.

The lighting devices according to the present inventive subject matter can comprise any desired number of solid state light emitters and lumiphors. For example, a lighting device according to the present inventive subject matter can include 50 or more solid state light emitters, or can include 100 or more solid state light emitters, etc.

The sources of visible light in the lighting devices of the present inventive subject matter can be arranged, mounted and supplied with electricity in any desired manner, and can be mounted on any desired housing or fixture. Representative examples of suitable arrangements are described in:

U.S. patent application Ser. No. 12/017,558, filed on Jan. 22, 2008, (now U.S. Patent Publication No. 2008/0179602), entitled "FAULT TOLERANT LIGHT EMITTERS, SYSTEMS INCORPORATING FAULT TOLERANT LIGHT EMITTERS AND METHODS OF FABRICATING FAULT TOLERANT LIGHT EMITTERS" (inventors: Gerald H. Negley and Antony Paul van de Ven), U.S. patent application Ser. No. 60/885,937, filed on Jan. 22, 2007, entitled "HIGH VOLTAGE SOLID STATE LIGHT EMITTER" (inventor: Gerald H. Negley), U.S. patent application Ser. No. 60/982,892, filed on Oct. 26, 2007, entitled "FAULT TOLERANT LIGHT EMITTERS, SYSTEMS INCORPORATING FAULT TOLERANT LIGHT EMITTERS AND METHODS OF FABRICATING FAULT TOLERANT LIGHT EMITTERS" (inventors: Gerald H. Negley and Antony Paul van de Ven), and U.S. patent application Ser. No. 60/986,662, filed on Nov. 9, 2007, the entireties of which are hereby incorporated by reference;

U.S. patent application Ser. No. 12/017,600, filed on Jan. 22, 2008, (now U.S. Patent Publication No. 2008/0211416), entitled "ILLUMINATION DEVICES USING EXTERNALLY INTERCONNECTED ARRAYS OF LIGHT EMITTING DEVICES, AND METHODS OF FABRICATING SAME" (inventors: Gerald H. Negley and Antony Paul van de Ven), U.S. patent application Ser. No. 60/982,909, filed on Oct. 26, 2007 (inventors: Gerald H. Negley and Antony Paul van de Ven) and U.S. patent application Ser. No. 60/986,795, filed Nov. 9, 2007, the entireties of which are hereby incorporated by reference; and U.S. patent application Ser. No. 12/017,676, filed on Jan. 22, 2008, (now U.S. Patent Publication No. 2009/0108269), entitled "ILLUMINATION DEVICE HAVING ONE OR MORE LUMIPHORS, AND METHODS OF FABRICATING SAME" (inventors: Gerald H. Negley and Antony Paul van de Ven), U.S. patent application Ser. No. 60/982,900, filed on Oct. 26, 2007 (inventors: Gerald H. Negley and Antony Paul van de Ven), the entirety of which is hereby incorporated by reference.

In addition, skilled artisans are familiar with a wide variety of arrangements, mounting schemes, power supplying apparatuses, housings and fixtures, and any such arrangements, schemes, apparatuses, housings and fixtures can be employed in connection with the present inventive subject matter. The lighting devices of the present inventive subject matter can be electrically connected (or selectively connected) to any desired power source, persons of skill in the art being familiar with a variety of such power sources.

The solid state light emitters and lumiphors can be arranged in any desired pattern.

The devices according to the present inventive subject matter can further comprise one or more long-life cooling device (e.g., a fan with an extremely high lifetime). Such long-life cooling device(s) can comprise piezoelectric or magnetorestrictive materials (e.g., MR, GMR, and/or HMR materials) that move air as a "Chinese fan". In cooling the devices according to the present inventive subject matter, typically only enough air to break the boundary layer is required to induce temperature drops of 10 to 15 degrees C. Hence, in such cases, strong "breezes" or a large fluid flow rate (large CFM) are typically not required (thereby avoiding the need for conventional fans).

The devices according to the present inventive subject matter can further comprise secondary optics to further change the projected nature of the emitted light. Such secondary optics are well-known to those skilled in the art, and so they do not need to be described in detail herein—any such secondary optics can, if desired, be employed.

The devices according to the present inventive subject matter can further comprise sensors or charging devices or cameras, etc. For example, persons of skill in the art are familiar with, and have ready access to, devices which detect one or more occurrence (e.g., motion detectors, which detect motion of an object or person), and which, in response to such detection, trigger illumination of a light, activation of a security camera, etc. As a representative example, a device according to the present inventive subject matter can include a lighting device according to the present inventive subject matter and a motion sensor, and can be constructed such that (1) while the light is illuminated, if the motion sensor detects movement, a security camera is activated to record visual data at or around the location of the detected motion, or (2) if the motion sensor detects movement, the light is illuminated to light the region near the location of the detected motion and the security camera is activated to record visual data at or around the location of the detected motion, etc.

Embodiments in accordance with the present inventive subject matter are described herein with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present inventive subject matter.

Figure 4:
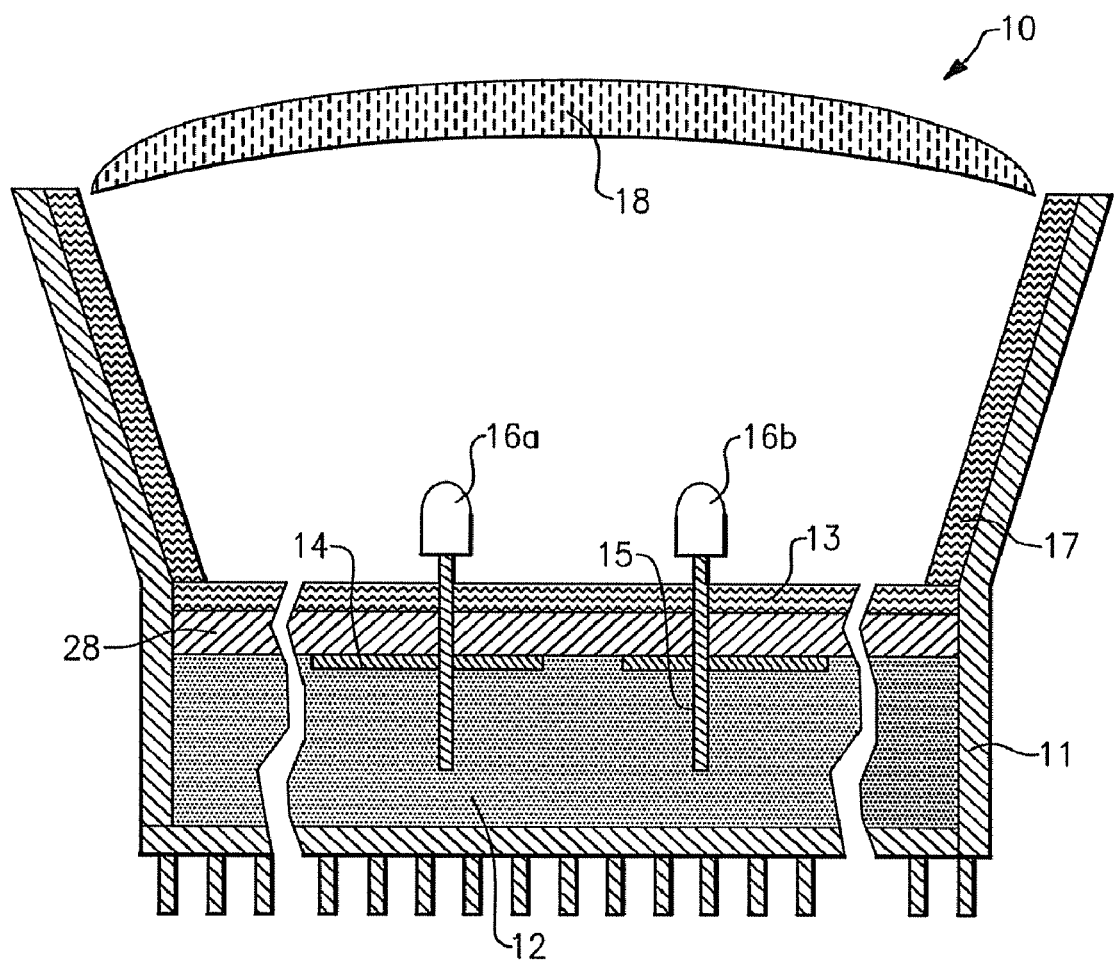
FIG. 4 depicts a first embodiment of a lighting device according to the present inventive subject matter.

FIG. 4 depicts a first embodiment of a lighting device in accordance with the present inventive subject matter.

Referring to FIG. 4, there is shown a lighting device 10 which includes a heat spreading element 11 (formed of aluminum), insulating regions 12 (comprising any desired material which is thermally conductive and not electrically conductive, a wide variety of which are well-known to those skilled in the art, e.g., ceramic, epoxy or silicone optionally filled with silicon carbide, diamond, cubic boron nitride, alumina, etc), a highly reflective surface 13 (formed in situ by polishing the surface of the aluminum heat spreading element, or made of MCPET® (marketed by Furukawa, a Japanese corporation)), conductive traces 14 formed of copper, lead frames 15 formed of silver-plated copper (or silver-plated mild steel), first and second packaged LEDs 16a and 16b (described in more detail below), a reflective cone 17 (made of MCPET®) with a diffuse light scattering surface and a diffusing element 18 (the diffusing element 18 performs a light scattering function). The diffusing element 18 is made of glass or plastic with surface features. The device depicted in FIG. 4 further includes a printed circuit board (PCB) 28 with the conductive traces 14.

Figure 5:
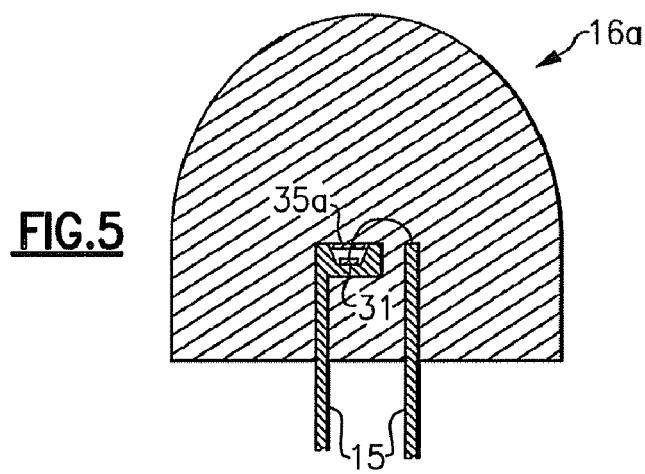
FIG. 5 is a sectional view of the packaged LED 16a in the embodiment depicted in FIG. 4.

The first packaged LED 16a is depicted in FIG. 5, and comprises an LED chip 31 which, when illuminated, emits light having a peak wavelength in the near ultraviolet range and a lumiphor 35a which, when excited, emits light having a dominant wavelength in the range of from about 490 nm to about 555 nm.

Figure 6:
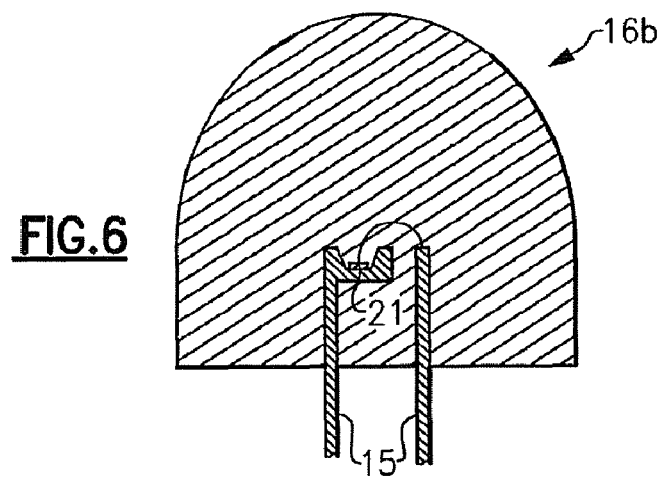
FIG. 6 is a sectional view of the packaged LED 16b in the embodiment depicted in FIG. 4.

The second packaged LED 16b is depicted in FIG. 6, and comprises an LED chip 21 which, when illuminated, emits light having a dominant wavelength in the range of from about 600 nm to about 630 nm (and the LED 16b does not comprise any lumiphor).

The heat spreading element 11 serves to spread out the heat, act as a heat sink, and dissipate the heat from the LEDs. Likewise, the reflective cone 17 functions as a heat sink.

The light exiting the lighting device 10 which was emitted by the first packaged LED 16a corresponds to a point on the 1931 CIE Chromaticity Diagram having x, y color coordinates which define a point which is within the first area on a 1931 CIE Chromaticity Diagram, i.e., an area enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38, specific examples including a point having x, y color coordinates of 0.3706, 0.4370 for 2850 K light, and 0.3550, 0.4089 for 3400 K light.

A combination of the light exiting the lighting device 10 which was emitted by the first packaged LED 16a and the light exiting the lighting device 10 which was emitted by the second packaged LED 16b corresponds to a point on a 1931 CIE Chromaticity Diagram which is within ten MacAdam ellipses of at least one point on the blackbody locus on a 1931 CIE Chromaticity Diagram.

Figure 7:
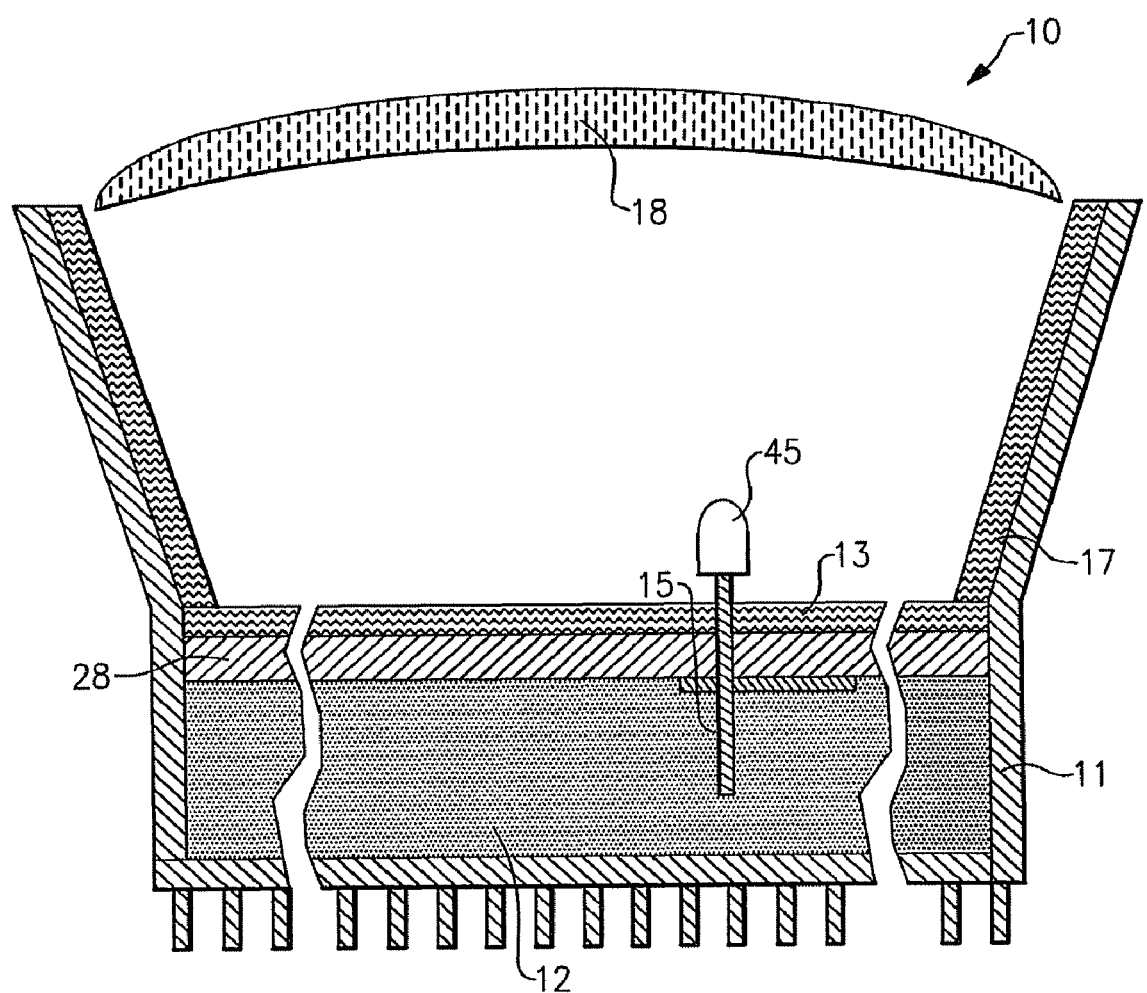
FIG. 7 depicts a second embodiment of a lighting device according to the present inventive subject matter.
Figure 8:
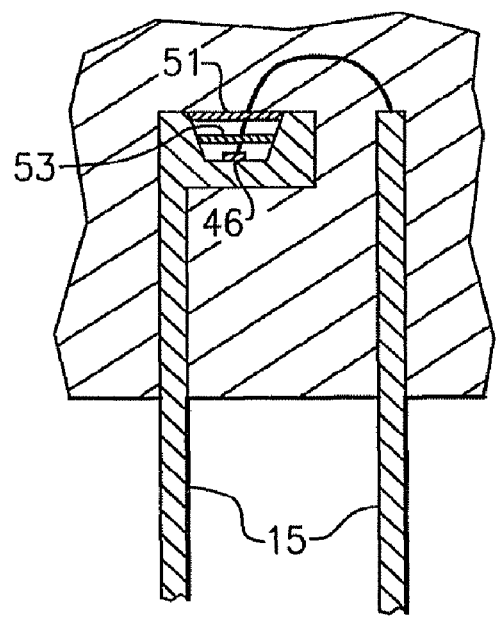
FIG. 8 is a sectional view of a portion of the packaged LED 45 in the embodiment depicted in FIG. 7.

FIG. 7 depicts a second embodiment of a lighting device in accordance with the present inventive subject matter. The second embodiment is similar to the first embodiment, except that in place of the first packaged LED 16a and the second packaged LED 16b, the second embodiment instead comprises a packaged LED 45 (see FIG. 8, which depicts a portion of the LED 45) which comprises an LED chip 46, a first lumiphor 53 and a second lumiphor 51. The LED chip 46, when illuminated, emits light having a peak wavelength in the near ultraviolet range. The first lumiphor 53, when excited, emits light having a dominant wavelength in the range of from about 490 nm to about 555 nm. The second lumiphor 51, when excited, emits light having a dominant wavelength in the range of from about 600 nm to about 630 nm.

Figure 9:
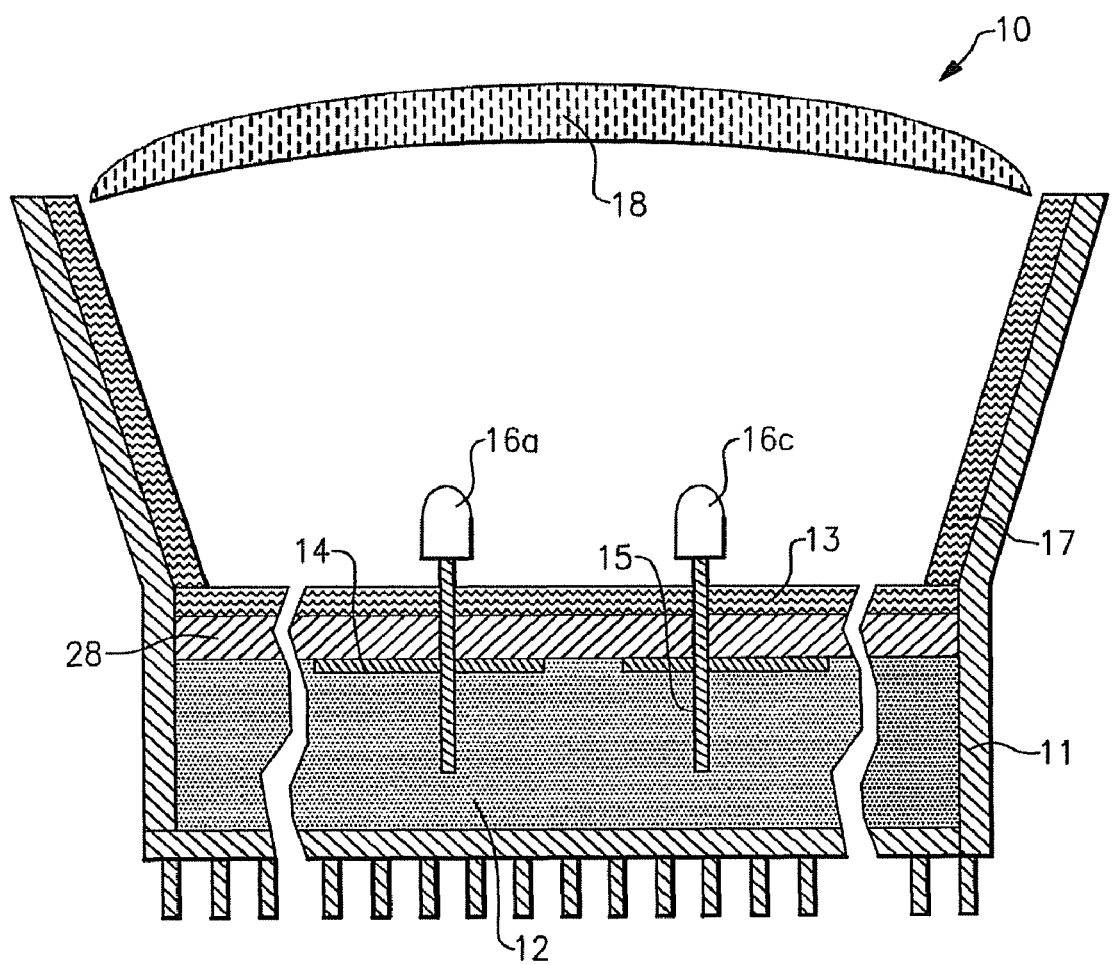
FIG. 9 depicts a third embodiment of a lighting device according to the present inventive subject matter.
Figure 10:
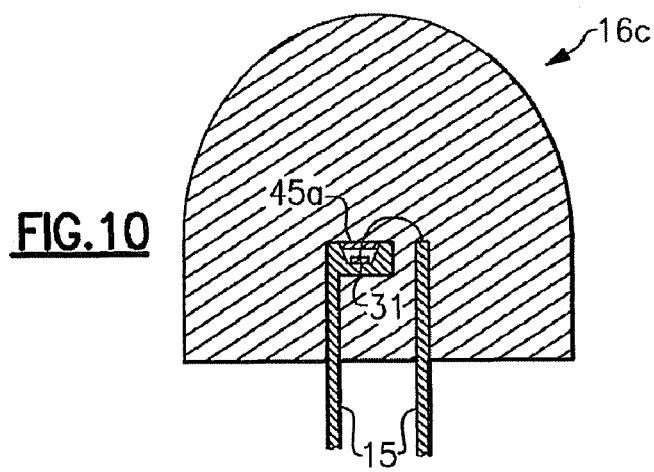
FIG. 10 is a sectional view of a portion of the packaged LED 16c in the embodiment depicted in FIG. 9.

FIG. 9 depicts a third embodiment of a lighting device in accordance with the present inventive subject matter. The third embodiment is similar to the first embodiment, except that in place of the second packaged LED 16b, the third embodiment instead comprises a packaged LED 16c (depicted in FIG. 10) which includes an LED chip 31 which, when illuminated, emits light having a peak wavelength in the near ultraviolet range and a lumiphor 45a which, when excited, emits light having a dominant wavelength in the range of from about 600 nm to about 630 nm.

Figure 11:
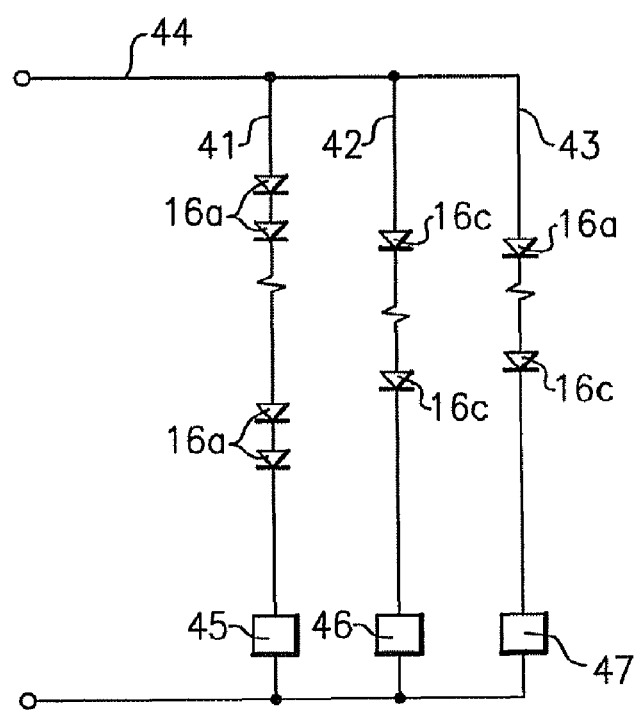
FIG. 11 is a schematic electrical diagram of a portion of the circuitry in the device depicted in FIG. 9.

Referring to FIG. 11, which is a schematic electrical diagram of a portion of the circuitry in the device depicted in FIG. 9, the lighting device includes a first string 41 of LEDs 16a, a second string 42 of LEDs 16c and a third string 43 including a mixture of LEDs 16a and LEDs 16c, the strings being arranged in parallel with one another and being electrically connected to a common power line 44. Each string includes a respective current regulator 45, 46, 47.

Figure 12:
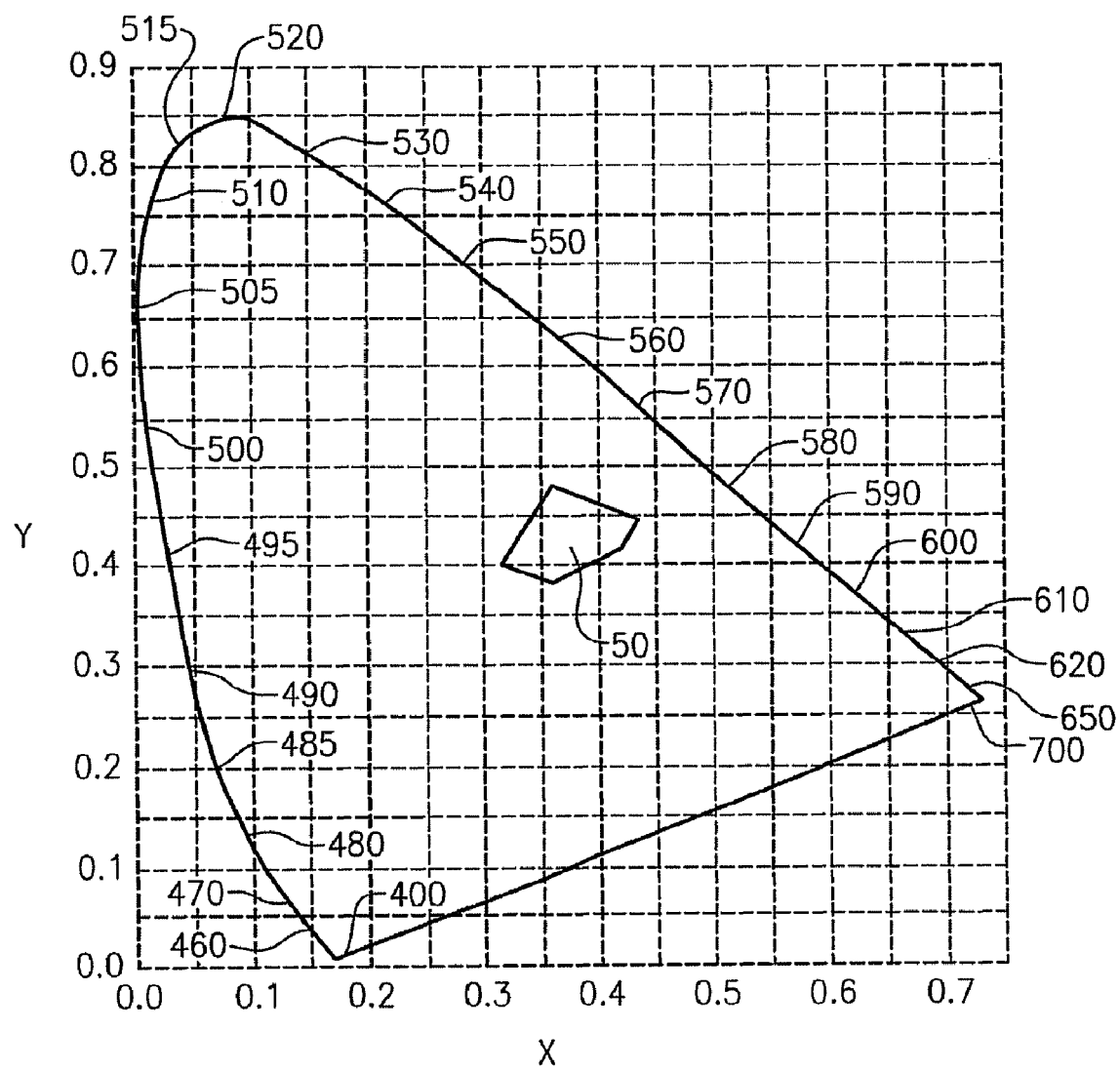
FIG. 12 depicts an area on a 1931 CIE Chromaticity Diagram enclosed by first, second, third, fourth and fifth line segments as described herein.

FIG. 12 depicts an area 50 on a 1931 CIE Chromaticity Diagram which is enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

For indoor residential illumination a color temperature of 2700 k to 3300 k is normally preferred, and for outdoor flood lighting of colorful scenes a color temperature approximating daylight 5000K (4500-6500K) is preferred.

Any two or more structural parts of the lighting devices described herein can be integrated. Any structural part of the lighting devices described herein can be provided in two or more parts (which can be held together, if necessary).

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

The invention claimed is:

1. A lighting device comprising:
   a first group of solid state light emitters; and
   at least a first luminescent material;
   wherein:
      said first group of solid state light emitters, if illuminated, would emit light having a peak wavelength in the near ultraviolet range;
      said first luminescent material, if excited, would emit light having a dominant wavelength in the range of from about 490 nm to about 555 nm;
      if said first group of solid state light emitters is illuminated, a mixture of (1) light emitted from said lighting device which was emitted by said first group of solid state light emitters and (2) light emitted from said lighting device which was emitted by said first luminescent material would, in the absence of any additional light, have a mixed illumination having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

2. A lighting device as recited in claim 1, wherein said first group of solid state light emitters consists of a single solid state light emitter.

3. A lighting device as recited in claim 1, wherein said first group of solid state light emitters comprises a plurality of solid state light emitters.

4. A lighting device as recited in claim 1, wherein at least one of said first group of solid state light emitters comprises a light emitting diode.

5. A lighting device as recited in claim 1, wherein said lighting device comprises at least a first package, said first package comprising at least one of said first group of solid state light emitters and at least a first lumiphor comprising said first luminescent material.

6. A lighting device as recited in claim 1, wherein said first group of solid state light emitters, if illuminated, would emit light having a peak wavelength in the range of from about 380 nm to about 430 nm.

7. A lighting device as recited in claim 1, wherein said first group of solid state light emitters, if illuminated, would emit light having a peak wavelength in the range of from about 380 nm to about 410 nm.

8. A lighting device as recited in claim 7, wherein said first luminescent material, if excited, would emit light having a dominant wavelength of about 490 nm.

9. A lighting device as recited in claim 1, wherein said first luminescent material, if excited, would emit light having a dominant wavelength of about 490 nm.

10. A lighting device as recited in claim 1, wherein said lighting device further comprises at least one light emitter which emits light having a dominant wavelength in the range of from about 600 nm to about 630 nm.

11. A lighting device as recited in claim 10, wherein if said first group of solid state light emitters is illuminated and said at least one light emitter which emits light having a dominant wavelength in the range of from about 600 nm to about 630 nm is illuminated, a mixture of (1) light emitted from said lighting device which was emitted by said first group of solid state light emitters, (2) light emitted from said lighting device which was emitted by said first luminescent material, and (3) light emitted from said lighting device which was emitted by said at least one light emitter which emits light having a dominant wavelength in the range of from about 600 nm to about 630 nm would, in the absence of any additional light, have a combined illumination having x, y coordinates on a 1931 CIE Chromaticity Diagram which define a point which is within twenty MacAdam ellipses of at least one point on the blackbody locus on a 1931 CIE Chromaticity Diagram.

12. A lighting device as recited in claim 10, wherein said lighting device comprises at least a first package, said first package comprising at least one of said first group of solid state light emitters and at least one of said at least one light emitter which emits light having a dominant wavelength in the range of from about 600 nm to about 630 nm.

13. A lighting device as recited in claim 10, wherein said lighting device comprises at least a first package, said first package comprising at least one of said first group of solid state light emitters, at least a portion of said first luminescent material, and at least one of said at least one light emitter which emits light having a dominant wavelength in the range of from about 600 nm to about 630 nm.

14. A lighting device as recited in claim 10, wherein said at least one light emitter which emits light having a dominant wavelength in the range of from about 600 nm to about 630 nm is at least one solid state light emitter.

15. A lighting device as recited in claim 14, wherein at least one of said at least one light emitter which emits light having a dominant wavelength in the range of from about 600 nm to about 630 nm comprises a light emitting diode.

16. A lighting device as recited in claim 10, wherein said at least one light emitter which emits light having a dominant wavelength in the range of from about 600 nm to about 630 nm comprises at least a second luminescent material.

17. A lighting device as recited in claim 1, wherein said lighting device comprises at least a first packaged solid state light emitter and a second packaged solid state light emitter,
   said first packaged solid state light emitter comprising a first of said first group of solid state light emitters and a portion of said first luminescent material;
   said second packaged solid state light emitter comprising a second of said first group of solid state light emitters.

18. A lighting device as recited in claim 1, wherein said lighting device further comprises an encapsulant and is in the form of a packaged solid state light emitter.

19. A lighting device as recited in claim 1, wherein:
   said lighting device further comprises at least a first power line, and
   if energy is supplied to said first power line, a mixture of (1) light emitted from said lighting device which was emitted by said first group of solid state light emitters and (2) light emitted from said lighting device which was emitted by said first luminescent material would, in the absence of any additional light, have a mixed illumination having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

20. A lighting device as recited in claim 19, wherein:
said lighting device further comprises at least a second luminescent material,
said second luminescent material, if excited, would emit light having a dominant wavelength in the range of from about 600 nm to about 630 nm, and
if energy is supplied to said first power line, a mixture of (1) light emitted from said lighting device which was emitted by said first group of solid state light emitters, (2) light emitted from said lighting device which was emitted by said first luminescent material, and (3) light emitted from said lighting device which was emitted by said second luminescent material would, in the absence of any additional light, have a combined illumination having x, y coordinates on a 1931 CIE Chromaticity Diagram which define a point which is within twenty MacAdam ellipses of at least one point on the blackbody locus on a 1931 CIE Chromaticity Diagram.

21. A lighting device as recited in claim 19, wherein:
said lighting device further comprises a second group of solid state light emitters,
said second group of solid state light emitters, if illuminated, would emit light having a dominant wavelength in the range of from about 600 nm to about 630 nm, and
if energy is supplied to said first power line, a mixture of (1) light emitted from said lighting device which was emitted by said first group of solid state light emitters, (2) light emitted from said lighting device which was emitted by said first luminescent material, and (3) light emitted from said lighting device which was emitted by said second group of solid state light emitters would, in the absence of any additional light, have a combined illumination having x, y coordinates on a 1931 CIE Chromaticity Diagram which define a point which is within twenty MacAdam ellipses of at least one point on the blackbody locus on a 1931 CIE Chromaticity Diagram.

22. A lighting device as recited in claim 19, wherein if energy is supplied to said first power line, a mixture of all light emitted from said lighting device from solid state light emitters and luminescent material which emit light having a dominant wavelength which is outside the range of between 600 nm and 700 nm would have x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

23. A lighting device as recited in claim 1, wherein:
said lighting device further comprises at least a second luminescent material,
said second luminescent material, if excited, would emit light having a dominant wavelength in the range of from about 600 nm to about 630 nm, and
said first luminescent material and said second luminescent material is provided in a single first group-second group lumiphor.

24. A lighting device as recited in claim 1, wherein:
said lighting device further comprises a second luminescent material,
said second luminescent material, if excited, would emit light having a dominant wavelength in the range of from about 600 nm to about 630 nm, and
said lighting device comprises at least a first mixed lumiphor, said first mixed lumiphor comprising at least a portion of said first luminescent material and at least a portion of said second luminescent material.

25. A lighting device as recited in claim 1, wherein if said first group of solid state light emitters is illuminated, said mixture would have a CRI Ra of at least 85.

26. A method of lighting, comprising:
illuminating a first group of solid state light emitters, such that said first group of solid state light emitters emits light having a peak wavelength in the near ultraviolet range;
exciting a first luminescent material, such that said first luminescent material emits light having a dominant wavelength in the range of from about 490 nm to about 555 nm;
wherein:
a mixture of (1) light emitted from said lighting device which was emitted by said first group of solid state light emitters and (2) light emitted from said lighting device which was emitted by said first luminescent material would, in the absence of any additional light, have a mixed illumination having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

27. A method as recited in claim 26, wherein at least one of said first group of solid state light emitters comprises a light emitting diode.

28. A method as recited in claim 26, wherein light emitted from said first group of solid state light emitters excites at least a portion of said first luminescent material.

29. A method as recited in claim 26, wherein said method further comprises exciting at least a second luminescent material, such that said second luminescent material emits light having a dominant wavelength in the range of from about 600 nm to about 630 nm.

30. A method as recited in claim 29, wherein a mixture of (1) light emitted from said lighting device which was emitted by said first group of solid state light emitters, (2) light emitted from said lighting device which was emitted by said first luminescent material, and (3) light emitted from said lighting device which was emitted by said second luminescent material would, in the absence of any additional light, have a combined illumination having x, y coordinates on a 1931 CIE Chromaticity Diagram which define a point which is within twenty MacAdam ellipses of at least one point on the blackbody locus on a 1931 CIE Chromaticity Diagram.

31. A method as recited in claim 29, wherein light emitted from said first group of solid state light emitters excites at least a portion of said second luminescent material.

32. A method as recited in claim 29, wherein light emitted from said first group of solid state light emitters excites at least a portion of said first luminescent material and at least a portion of said second luminescent material.

33. A method as recited in claim 26, wherein said method further comprises illuminating a second group of solid state light emitters, such that said second group of solid state light emitters emits light having a dominant wavelength in the range of from about 600 nm to about 630 nm.

34. A method as recited in claim 33, wherein a mixture of (1) light emitted from said lighting device which was emitted by said first group of solid state light emitters, (2) light emitted from said lighting device which was emitted by said first luminescent material, and (3) light emitted from said lighting device which was emitted by said second group of solid state light emitters would, in the absence of any additional light, have a combined illumination having x, y coordinates on a 1931 CIE Chromaticity Diagram which define a point which is within twenty MacAdam ellipses of at least one point on the blackbody locus on a 1931 CIE Chromaticity Diagram.

35. A method as recited in claim 33, wherein at least one of said second group of solid state light emitters comprises a light emitting diode.

36. A method as recited in claim 26, wherein said mixture has a CRI Ra of at least 85.

* * * * *